US00RE35416E

United States Patent [19]

Suzuki et al.

[11] E Patent Number: Re. 35,416

[45] Reissued Date of Patent: Dec. 31, 1996

[54] ACTIVE MATRIX LIQUID CRYSTAL DISPLAY DEVICE AND METHOD FOR PRODUCTION THEREOF

[75] Inventors: Katsumi Suzuki; Mitsutaka Nishikawa, both of Suwa, Japan

[73] Assignee: Seiko Epson Corporation, Tokyo, Japan

[21] Appl. No.: 271,400

[22] Filed: Jul. 6, 1994

Related U.S. Patent Documents

Reissue of:

[64] Patent No.: 5,128,784
Issued: Jul. 7, 1992
Appl. No.: 498,583
Filed: Mar. 23, 1990

[30] Foreign Application Priority Data

| | | | |
|---|---|---|---|
| Mar. 23, 1989 | [JP] | Japan | 1-71117 |
| Apr. 12, 1989 | [JP] | Japan | 1-92458 |
| Apr. 14, 1989 | [JP] | Japan | 1-95634 |
| Apr. 20, 1989 | [JP] | Japan | 1-100685 |
| Apr. 24, 1989 | [JP] | Japan | 1-103719 |
| Apr. 25, 1989 | [JP] | Japan | 1-105043 |
| Apr. 25, 1989 | [JP] | Japan | 1-105044 |
| Apr. 25, 1989 | [JP] | Japan | 1-105045 |
| Apr. 25, 1989 | [JP] | Japan | 1-105046 |
| Apr. 26, 1989 | [JP] | Japan | 1-106428 |
| May 9, 1989 | [JP] | Japan | 1-115572 |
| Nov. 8, 1989 | [JP] | Japan | 1-290525 |

[51] Int. Cl.[6] ..... G02F 1/13

[52] U.S. Cl. ..... 349/41; 349/138; 349/106; 349/143; 257/310

[58] Field of Search ..... 359/58, 79, 54, 359/68; 257/296, 310, 312

[56] References Cited

U.S. PATENT DOCUMENTS

| | | | |
|---|---|---|---|
| 4,413,883 | 11/1983 | Baraff et al. | 359/58 |
| 4,523,811 | 6/1985 | Ota | 359/58 |
| 4,534,623 | 8/1985 | Araki | 359/58 |
| 4,828,370 | 5/1989 | Suzuki | 359/57 |
| 4,861,141 | 8/1989 | Nakazawa | 359/58 |
| 4,871,234 | 10/1989 | Suzuki | 359/58 |
| 4,929,059 | 5/1990 | Takahashi | 359/79 |

FOREIGN PATENT DOCUMENTS

| | | |
|---|---|---|
| 62-59927 | 3/1987 | Japan . |
| 0155540 | 3/1989 | Japan . |
| 0120539 | 5/1989 | Japan . |

OTHER PUBLICATIONS

Niwa et al. "LCTV addressed by MIM devices", SID digest 84, pp. 304–307.

"A 250×240 Element LCD addressed by lateral MIM" by Mogozumi et al, Japan Display 83, pp. 404–407.

Gertenberg, "Properties of Anodic Films Formed on Reactively Sputtered Tantalum", J. of Electrochemical Society, vol. 113, No. 6, Jun. 1966, pp. 542–547.

Streater et al, "20.6/3:40 P.M. MIM addressed LCD's status and prospects", SID Int'l Symp. Dig. of Tech. Papers, May 1982, pp. 248–249.

*Primary Examiner*—Donald T. Hajec
*Assistant Examiner*—Tan Ho
*Attorney, Agent, or Firm*—Stroock & Stroock & Lavan

[57] ABSTRACT

Metal-insulator-metal devices having an insulation layer between two metal layers wherein the relative dielectric constant of the insulation layer is less than the relative dielectric constant of oxidized Ta, and $$C_{CF} \times C_{LC} / [(C_{CF} + C_{LC}) \times C_{MIM}] > 2$$

where $C_{CF}$ is the capacitance of the second substrate, $C_{LC}$ is the capacitance of the liquid crystal material, and $C_{MIM}$ is the capacitance of the metal-insulator-metal elements and an active matrix liquid crystal display panel including the metal-insulator-metal devices are provided. A method for producing such an active matrix liquid crystal display panel is also provided.

49 Claims, 9 Drawing Sheets

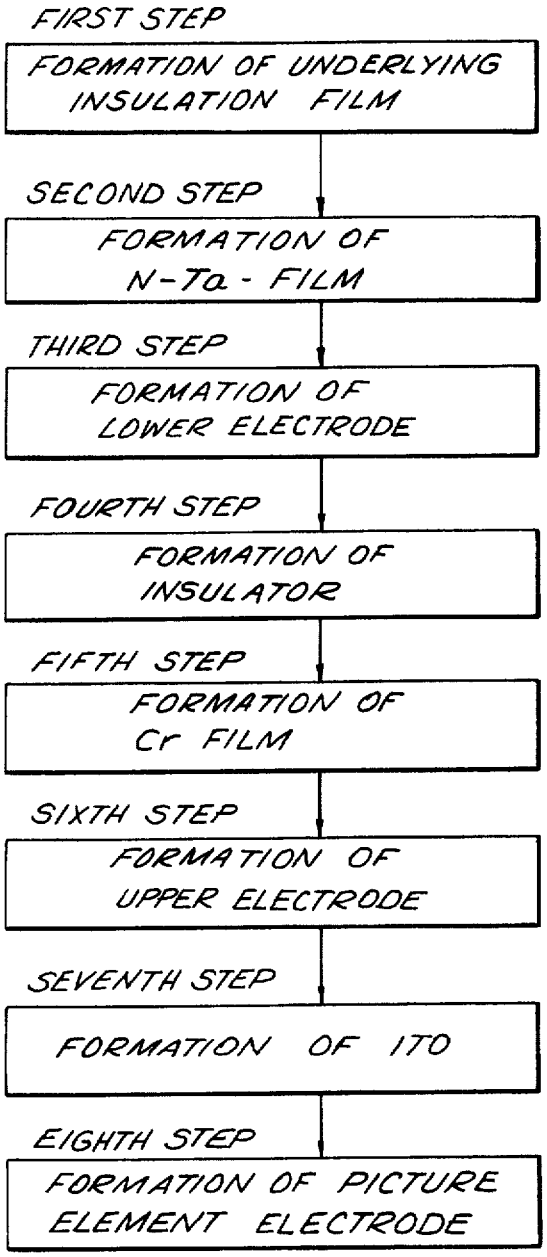
FIG. 3
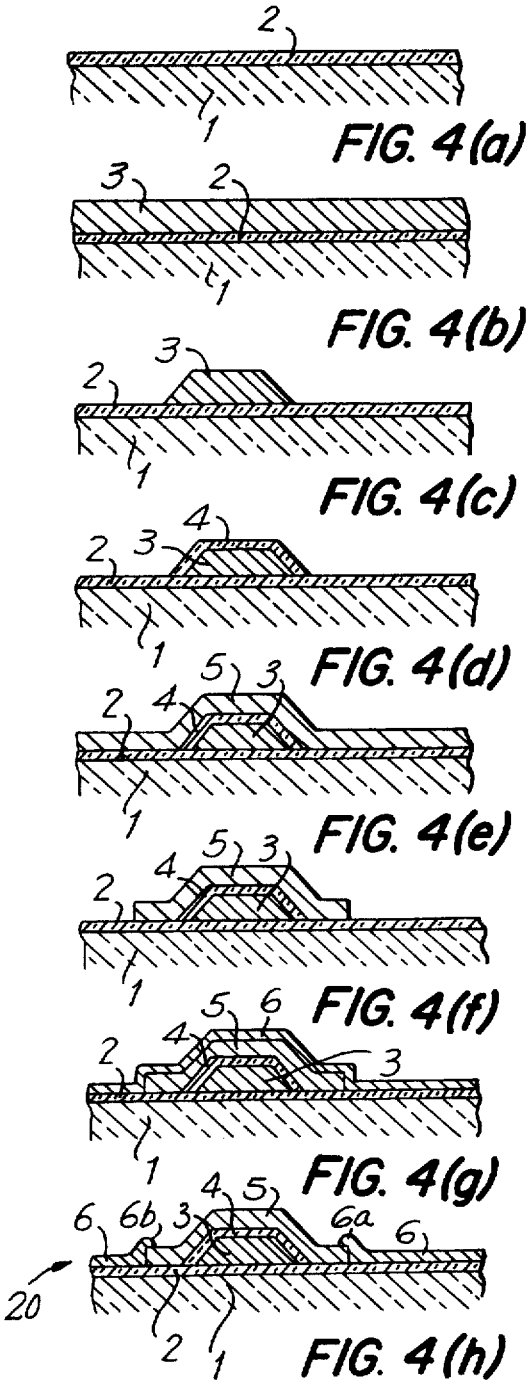

FIG. 11
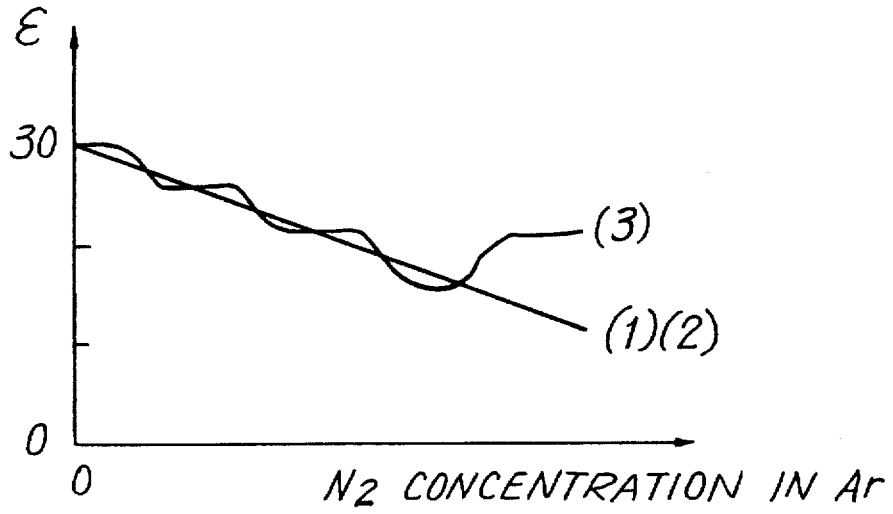
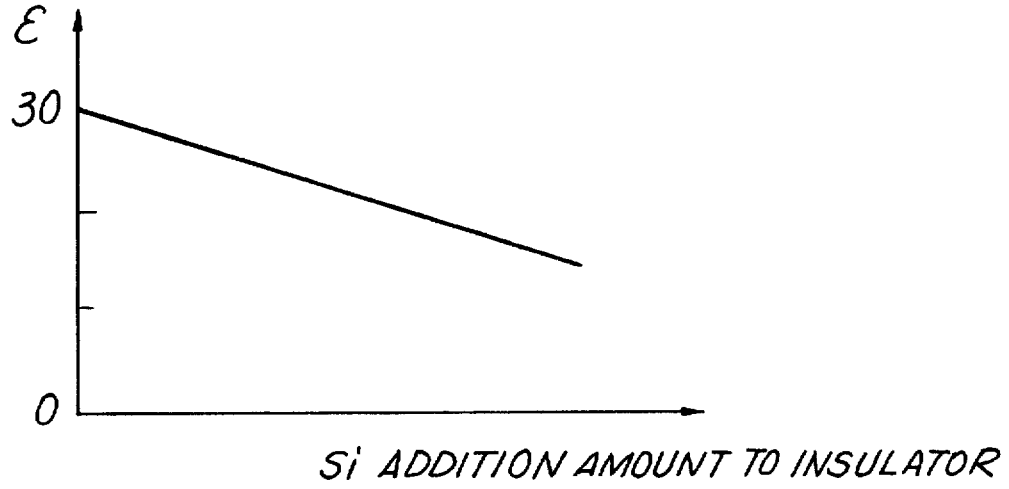
FIG. 12

ACTIVE MATRIX LIQUID CRYSTAL DISPLAY DEVICE AND METHOD FOR PRODUCTION THEREOF

Matter enclosed in heavy brackets [ ] appears in the original patent but forms no part of this reissue specification; matter printed in italics indicates the additions made by reissue.

BACKGROUND OF THE INVENTION

This invention relates to a liquid crystal display device and, in particular, to a liquid crystal display device which utilizes a metal-insulator-metal (MIM) element as a switching element.

The methods currently used for display of images in liquid crystal displays are broadly classified as the simple matrix method and the active matrix method. The simple matrix method includes a liquid crystal interposed between two opposed, perpendicularly-intersecting sets of multiple ribbon-like electrodes. A drive circuit is connected to each of the ribbon-like electrodes. While this method is inexpensive because of the simple structure, the resulting picture contrast is less than satisfactory due to cross-talk.

In contrast, the active matrix method utilizes switches which are coupled to each of the individual picture elements and, thus, permits voltage retention. Because the selected voltage is retained even during the course of timeshared driving, the resulting large display capacity provides excellent image qualities such as contrast. The active matrix method nevertheless has a complicated structure and so the production cost is high. For example, thin film transistors (TFTs) are one such active element, and in their manufacture, five or more photomasks must be used to improve the yield for stacking five or six layers of thin film. Accordingly, two-terminal elements which allow improved yield and reduced production costs have been used in favor of other active elements.

The metal-insulator-metal element (MIM) is representative of these two-terminal elements. The general structure of the MIM element is shown in FIGS. 2 and 3. The insulating films in conventional MIM elements are $TaO_x$ formed by anodic oxidation of a lower electrode. Since the relative dielectric constant is about 30, the element capacitance is as high as 0.1 pF when the size of the element is approximately 5 μm×4 μm and the anodic oxide film thickness is approximately 600 Å. This element capacitance is at least more than one-half of the liquid crystal capacitance per picture element.

Conventional MIM elements have three disadvantages. First, voltages applied to the liquid crystal panel are not fully applied to the MIM element because the capacity ratio of the capacitance of the liquid crystal to the MIM elements is 2 or less, and usually about 1.6. Thus, the switching property is inferior and the display quality of the liquid crystal panel is inferior to the quality of the TFT panel. One solution to this problem has been to reduce the size of the MIM element, such as to 3 μm×3 μm. However, this solution drastically reduces production yield. A second solution has been to increase the insulation film thickness, for example, to an anodized insulation film thickness of 1,000 Å. However, although this reduces the capacitance of the MIM element, the non-linear coefficient (βvalue) for the current-voltage of the MIM element is reduced, thereby negating the benefit of reduced capacitance.

The second disadvantage of conventional MIM elements is that the non-linear coefficient (βvalue) of the I-V characteristic in the conventional MIM element is less than 3.4 even at room temperature, and falls to about 2.5 at higher temperatures around 60° C. Moreover, the resistance of the MIM element in a low voltage area for R(3V) is as low as about $1\times10^{11}$ ohm at room temperature and about $5\times10^{9}$ ohm at 60° C.

The third disadvantage of conventional MIM elements is that picture element division is impossible for MIM elements because of their low capacitance. In contrast, TFTs have been adapted in recent years to allow such redundant designs and, thus, their production yield has been improved. Moreover, the TFT panel with this improved production yield is similar in cost to the conventional MIM element.

Accordingly, it is desirable to provide a liquid crystal device which utilizes a new MIM element which has increased capacitance, increased β value, decreased device resistance in the low voltage area and various temperatures, which allows for redundant design such as in picture element division, at a production cost comparable or less than the TFT panel.

SUMMARY OF THE INVENTION

Generally speaking, in accordance with the invention, an active matrix liquid crystal display device having a plurality of row electrodes disposed on a first substrate, a plurality of column electrodes disposed on a second opposed substrate such that the column electrodes oppose the row electrodes perpendicularly and the intersections of the electrodes forms a plurality of picture elements arranged in a matrix-like pattern, a plurality of nonlinear switching resistor elements, for coupling each picture element to one of the electrodes, and liquid crystal material located in the space between the first and second substrates, is provided. The non-linear switching resistor elements are metal-insulator-metal (MIM) two-terminal elements having an insulator layer between two metal layers. The relative dielectric constant of the insulator layer is less than 30, and $$C_{CF}\times C_{LC}/[(C_{CF}+C_{LC})\times C_{MIM}]>2$$

where $C_{CF}$ is the capacitance of the second substrate, $C_{LC}$ is the capacitance of the liquid crystal material, and $C_{MIM}$ is the capacitance of the MIM elements. A method for producing an active matrix liquid crystal display panel useful in such an active matrix liquid crystal display device is also provided.

Accordingly, it is an object of the invention to provide an improved liquid crystal display device.

It is another object of the invention to provide a liquid crystal display device which utilizes an improved metal-insulator-metal (MIM) element as a switching element.

It is a further object of the invention to provide a liquid crystal display device which has minimal cross-talk.

Yet another object of the invention is to provide a liquid crystal display device which is inexpensively manufactured of increased yields.

A further object of the invention is to provide a liquid crystal display device which utilizes a metal-insulator-metal element which has increased capacitance.

Still another object of the invention is to provide a liquid crystal display device which utilizes a metal-insulator-metal element which has increased β value.

Yet another object of the invention is to provide a liquid crystal display device which utilizes a metal-insulator-metal element which has decreased device resistance in the low voltage area and at various temperature.

A further object of the invention is to provide a liquid crystal display device which utilizes a metal-insulator-metal element which allows for redundant design such as in picture element division.

Yet a further object of the invention is to provide a liquid crystal display device which utilizes a metal-insulator-metal element which has a production cost comparable or less than the TFT panel.

Another object of the invention is to provide a method for producing such improved liquid crystal display devices.

Still other objects and advantages of the invention will in part be obvious and will in part be apparent from the specification.

The invention accordingly comprises the several steps and the relation of one o more of such steps with respect to each of the others, and the apparatus embodying features of construction, combination of elements and arrangement of parts which are adapted to effect such characteristics, all as exemplified in the following detailed disclosure, and the scope of the invention will be indicated in the claims.

BRIEF DESCRIPTION OF THE DRAWINGS

For a fuller understanding of the invention, reference is made to the following description taken in connection with the accompanying drawings, in which:

FIG. 3 is a flow diagram showing the steps to produce an active element in accordance with the invention;

FIGS. 4(a)–(h) are sectional views illustrating the steps from FIG. 3 to produce an active element in accordance with the invention;

FIG. 11 is a graph comparing three methods of nitrogen addition, an in particular, showing the $N_2$ concentration vs. the ε-stability, wherein the three methods are as follows:

Figure 13:
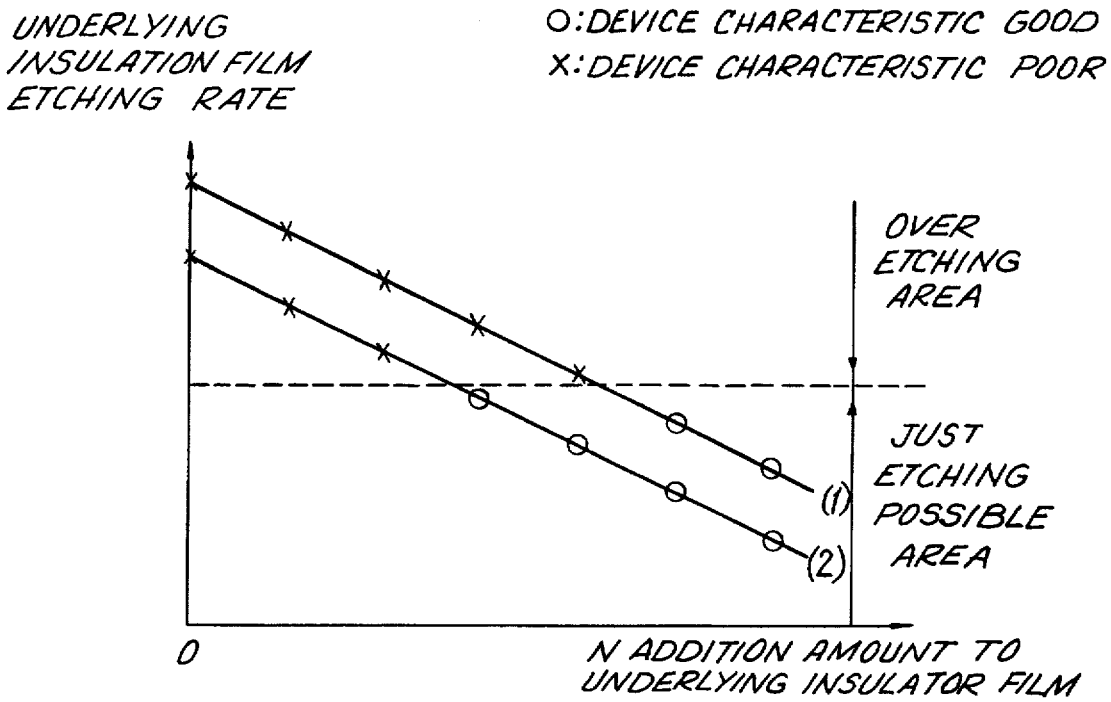
Figure 14:
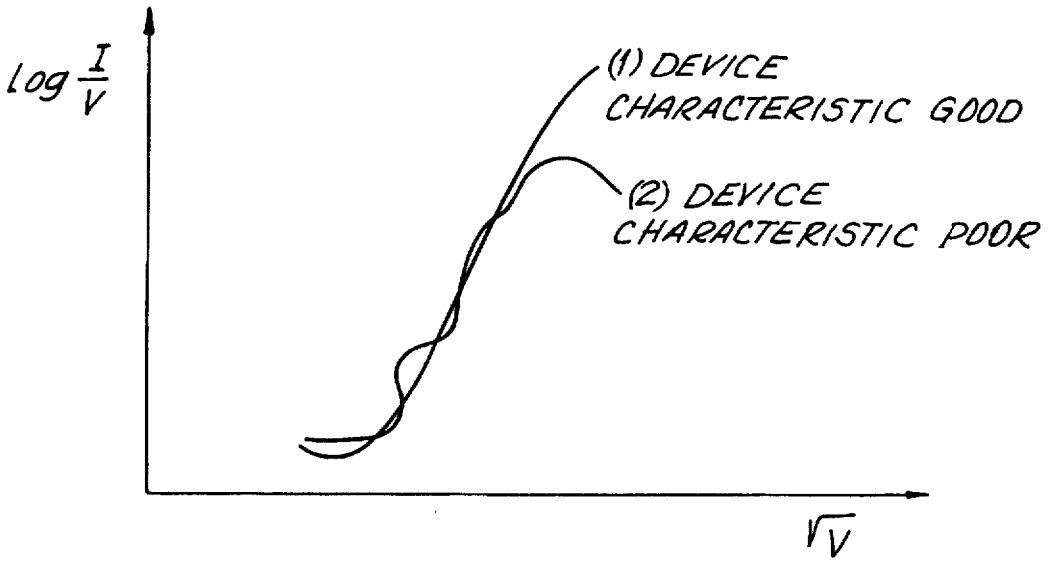
Figure 15:
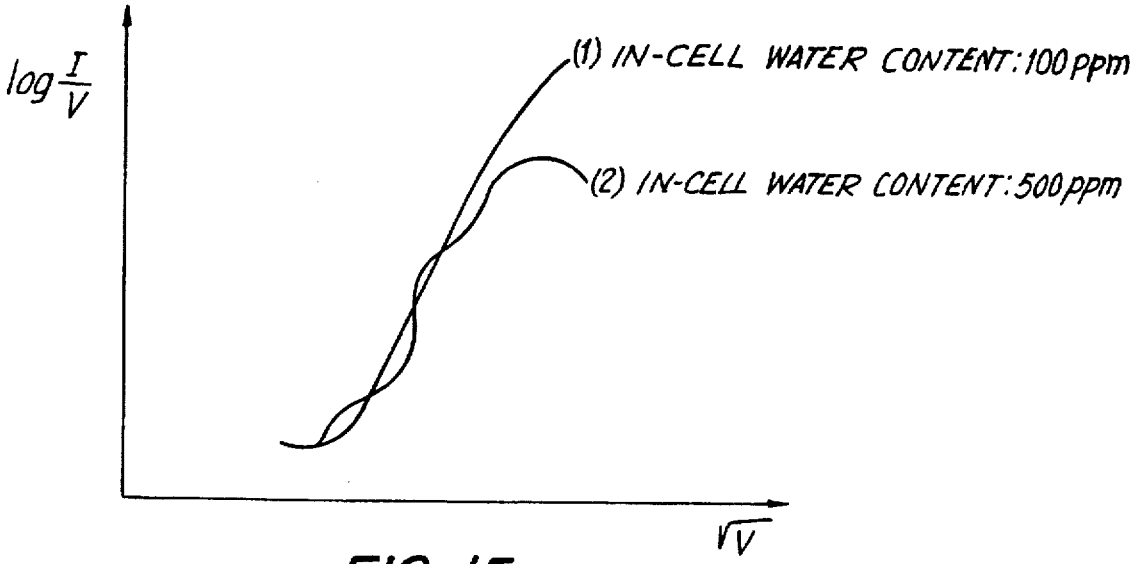
Figure 16:
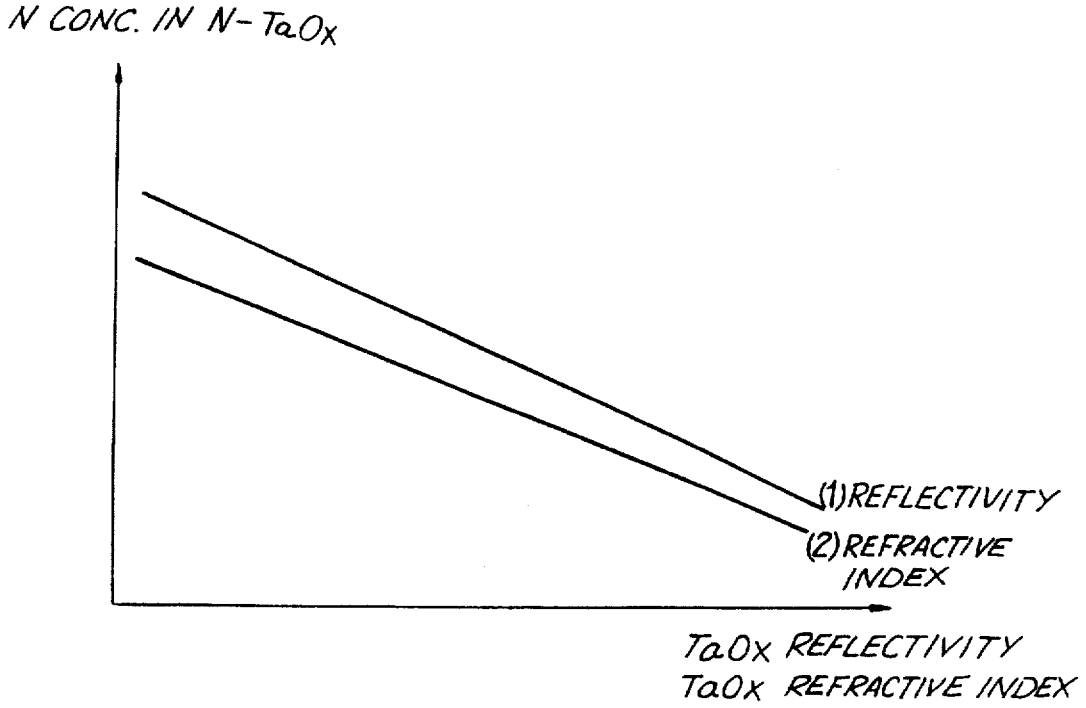
Figure 17:
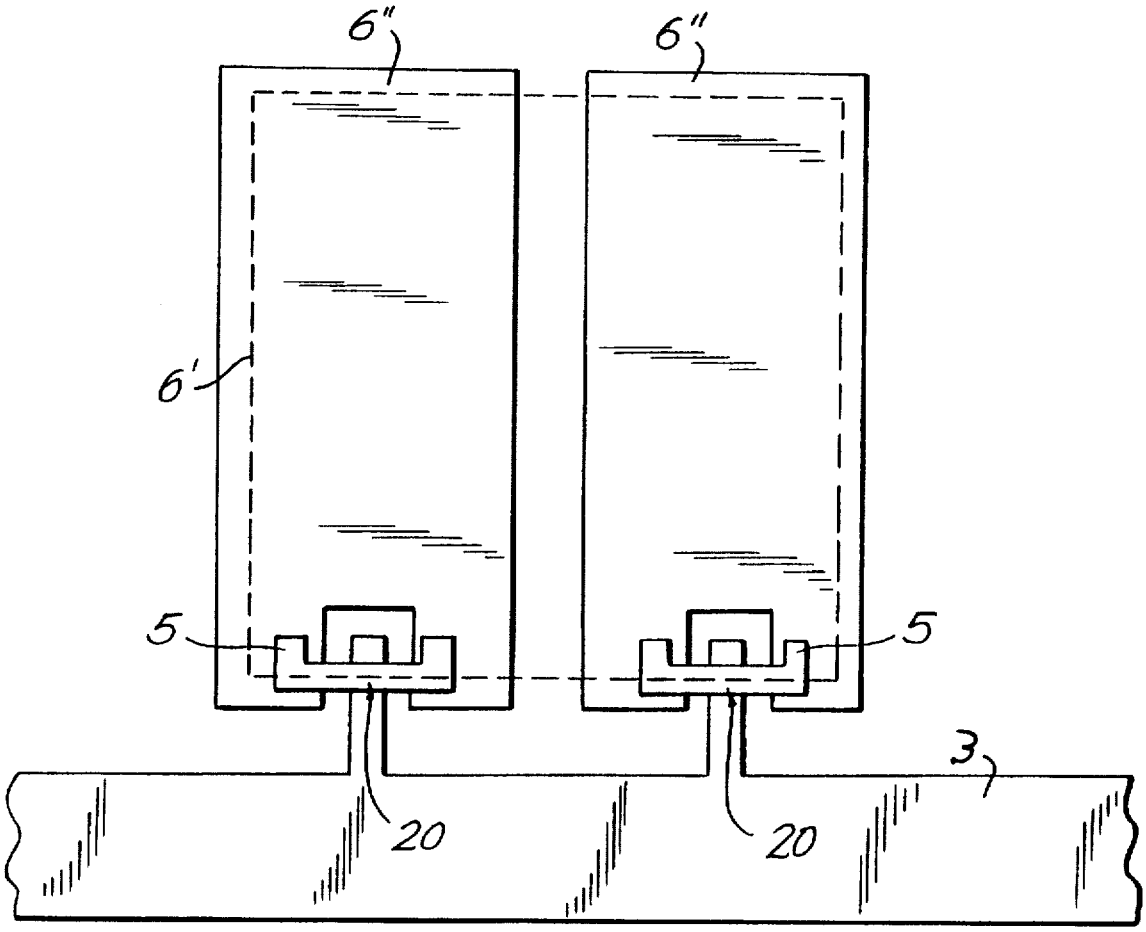

(1) a gas mixture cylinder introduces Ar and $N_2$ at an optimal and controlled concentration;

(2) a N-added Ta target is used; and (3) Ar and $N_2$ are separately introduced into a sputter chamber by a mass flow meter;

FIG. 12 is a graph showing the amount of Si added to the insulator vs. the ε-value;

FIG. 13 is a graph showing, in accordance with Example 2, the amount of N added to the underlying insulation film N-$TaO_x$ vs. the etching rate of the underlying insulation film, as well as the device characteristic, wherein the underlying layer is formed by reactive sputtering in curve (1) and the underlying layer is formed by thermal oxidation in curve (2);

FIG. 14 is a graph showing the curve of an element with stable characteristics and an element with unstable characteristics;

FIG. 15 is a graph showing the concentration of water in the liquid crystal cell vs. the I-V characteristic;

FIG. 16 is a graph showing the N concentration in the N-$TaO_x$ film vs. the refractive index and the reflectivity of the N-$TaO_x$ film; and FIG. 17 is a plan view of an MIM element prepared in accordance with Example 3 in which the element capacitance is reduced to one-half and which allows for redundant design such as in picture element division.

DESCRIPTION OF THE PREFERRED EMBODIMENTS

Figure 1:
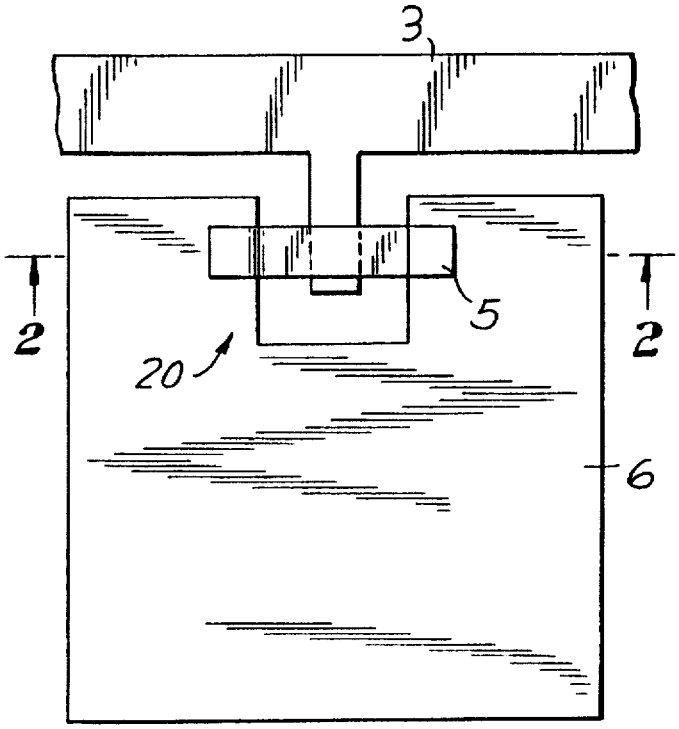
FIG. 1 is a plan view of an MIM element in accordance with the invention.
Figure 2:
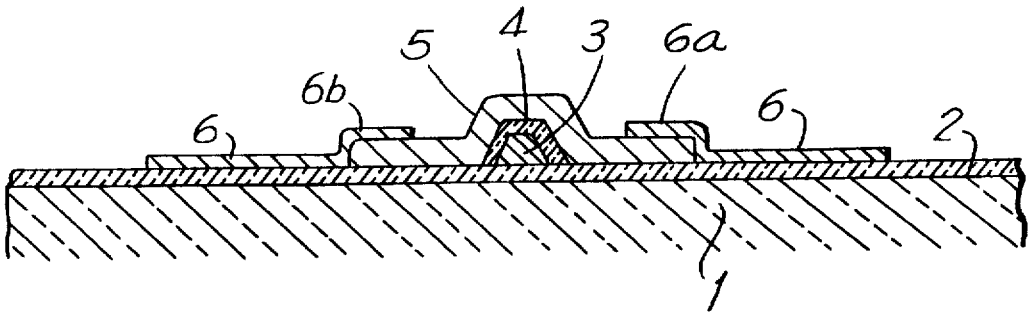
FIG. 2 is a cross-sectional view taken along 2—2 of FIG. 1.

FIGS. 1 and 2 show the structure of a metal-insulator-metal (MIM) element 20 constructed in accordance with the invention. An underlying insulation film 2 is disposed on a substrate 1. MIM element 2 includes a first metal layer 3 and a second metal layer 5 with an insulating layer 4 sandwiched between metal layers 3 and 5. A picture element electrode 6 overlaps a portion of second metal layers of MIM element 20 at points 6a and 6b.

FIG. 3 is a flow diagram showing the eight steps to produce active MIM element 20 in accordance with the invention. FIG. 4(a) through 4(h) are sectional views illustrating each of the steps identified in FIG. 3. These eight steps include the following:

(1) forming underlying insulating film 2;

(2) forming a Ta or N-Ta metal layer 3;

(3) pattern etching metal layer 3 formed in the second step;

(4) oxidizing the pattern-etched metal layer 3 into insulation layer 4;

(5) forming Cr metal layer [4] *5* on insulation layer 4 formed in the fourth step;

(6) pattern etching Cr metal layer [4] *5* formed in the fifth step, thereby forming an MIM element 3-4-5;

(7) forming an ITO film after the sixth step; and (8) etching the ITO film into picture element electrode 6.

Figure 5:
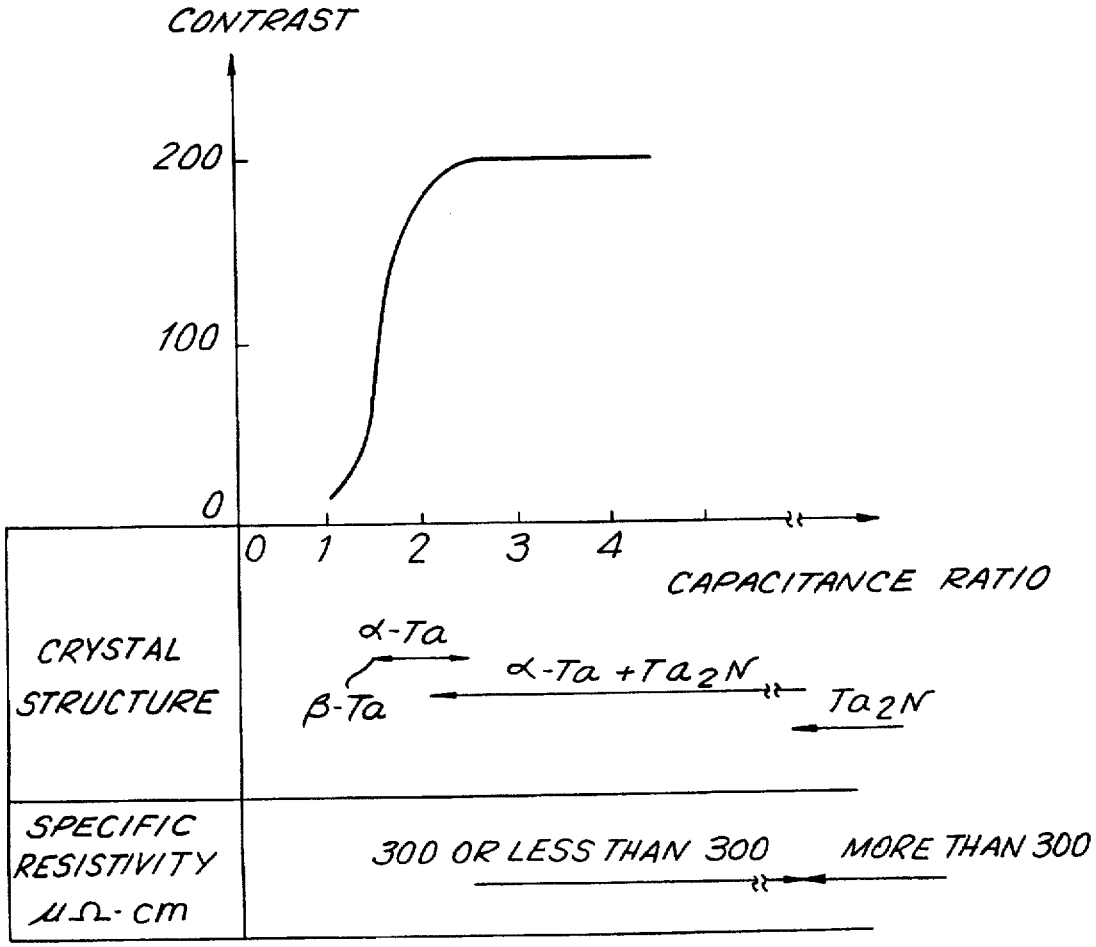
FIG. 5 is a graph showing the ratio of the liquid crystal capacitance to the capacitance of the MIM element vs. the panel contrast, and both the crystal structure and the specific resistivity of the lower Ta electrode vs. the capacitance ratio.

FIG. 5 is a graph which shows the ratio of the capacitance of the liquid crystal to the capacitance of the MIM element vs. the normally white-mode display panel contrast. By varying the amount of N added to Ta first metal layer 3, the dielectric constant ε value of anodized N-$TaO_x$ (where x is a Ta oxide) film 4 is changed to thereby vary the capacitance ratio. FIG. 5 also shows the crystal structure and the specific resistivity of Ta first metal layer 3 in this case.

Figure 6:
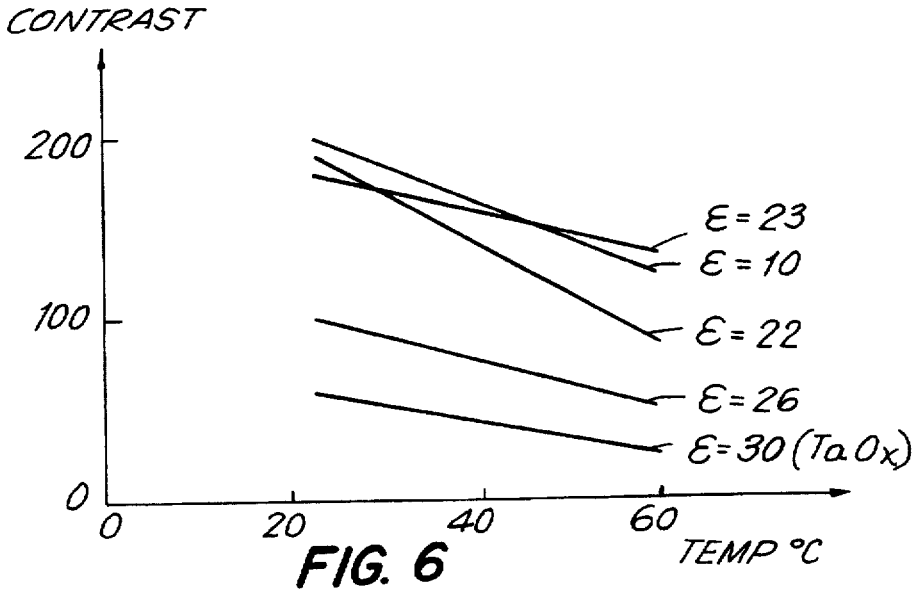
FIG. 6 is a graph showing the relative dielectric constant of the insulator vs. the temperature characteristic of the contrast.
Figure 7:
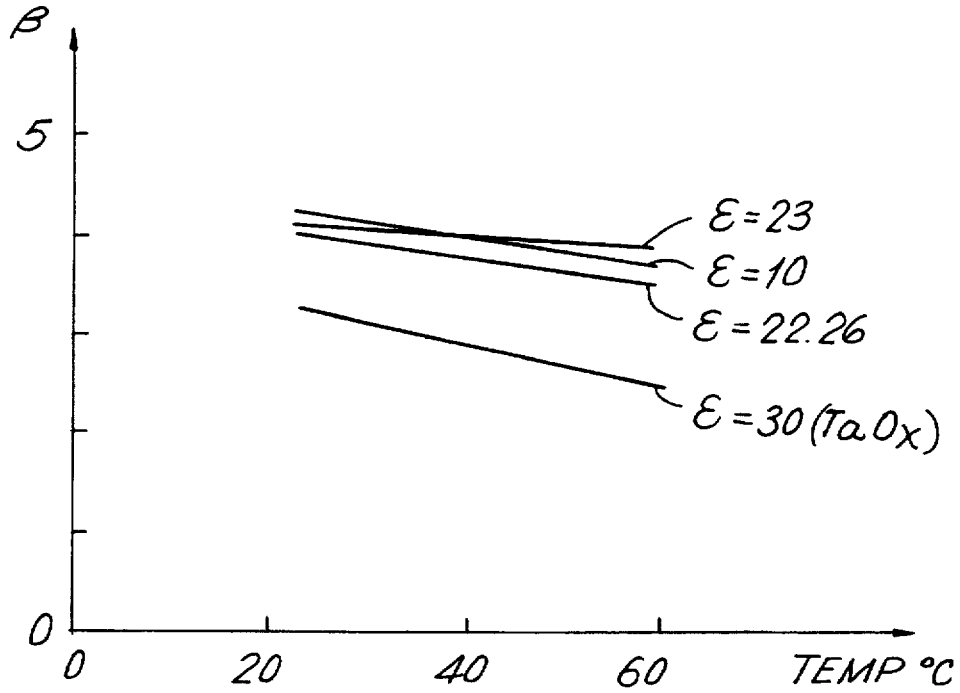
FIG. 7 is a graph showing the temperature characteristic of the MIM element's β-value vs. the relative dielectric constant of the insulator.
Figure 8:
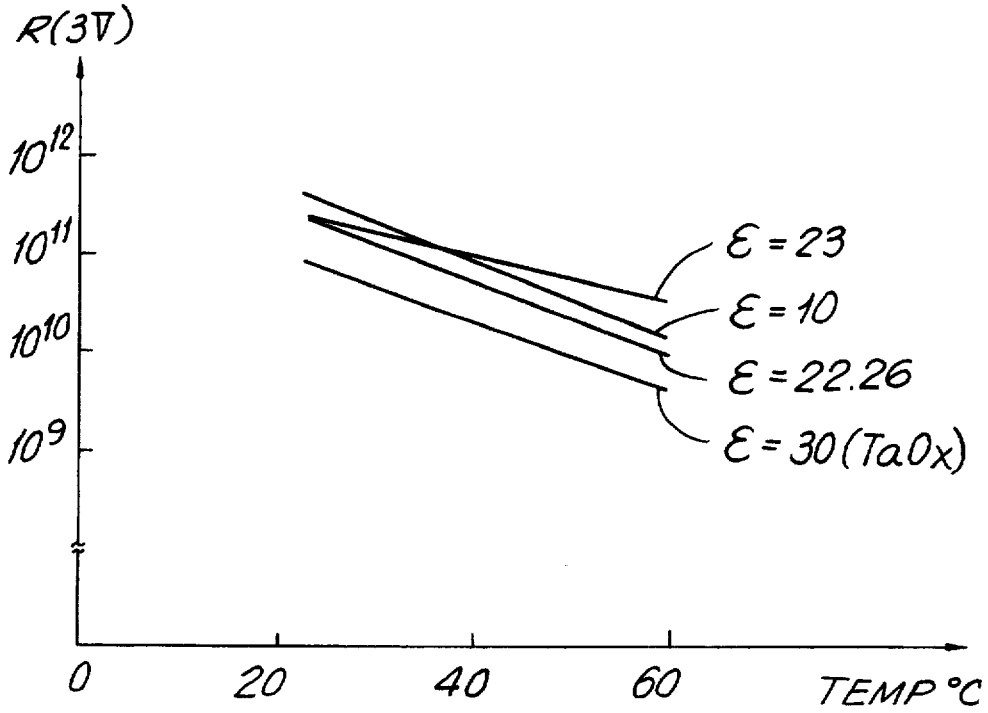
FIG. 8 is a graph showing the temperature characteristic of the device resistance at 3V vs. the relative dielectric constant of the insulator.

FIG. 6 shows the temperature characteristic of the contrast when the ε value is changed, FIG. 7 shows the temperature characteristic of the non-linear coefficient β value when ε value is changed, and FIG. 8 shows the temperature characteristic of the device resistance at R(3V) upon applying 3V. As can be seen from FIG. 6, if the value ε is 22 or less, contrast 85 can be secured even at 60° C. Although the contrast of the TFT panel is generally higher than 100, contrasts of more than 70–80 cannot clearly be distinguished by the human eye. Therefore, contrast comparable with that of TFT can be obtained if the ε value is 22 or less.

Panel contrast is poor at 60° C. when ε=26, although the β value and R(3V) remain satisfactory, perhaps because the capacitance ratio is as low as 1.9. Although the contrast is greatly improved even when ε=23 (which may be attributable to good temperature characteristics of R(3V) and β value), this data has only been obtained when applying sputtering by a 50B sputtering device manufactured by Tokuda Seisakusho. A contrast comparable to that of TFT, as occurs when $\epsilon \leqq 22$, was obtained using, as sputtering devices, model 4ES manufactured by Tokuda Seisakusho and model 530H manufactured by Nichiden Anerba. From these results, it can be determined that contrast comparable to that of TFT can be readily obtained when $\epsilon=22$ and the capacitance ratio is greater than 2. However, the contrast may be improved even if $\epsilon 22$, as long as $\epsilon<30$.

Redundant design such as bisecting a picture element is possible if $\epsilon \leqq 10$. In addition, since the capacitance ratio between the divided picture element and the device can become greater than 2, contrast comparable to that of TFT can be obtained. Alternatively, if contrast only at the same level as the conventional MIM element is required, a one inch panel with 50,000 picture elements can be obtained, which can be used in view finders and other devices in which MIM elements could not previously be used.

Figure 9:
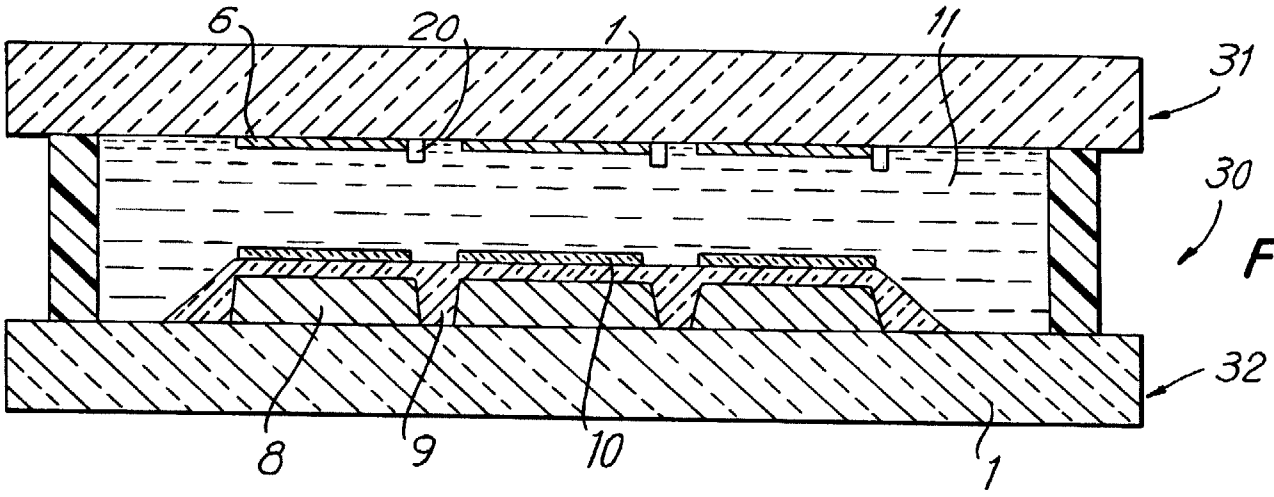
FIG. 9 is a sectional view showing the structure of a panel which includes color filters disposed on picture element electrodes.
Figure 10:
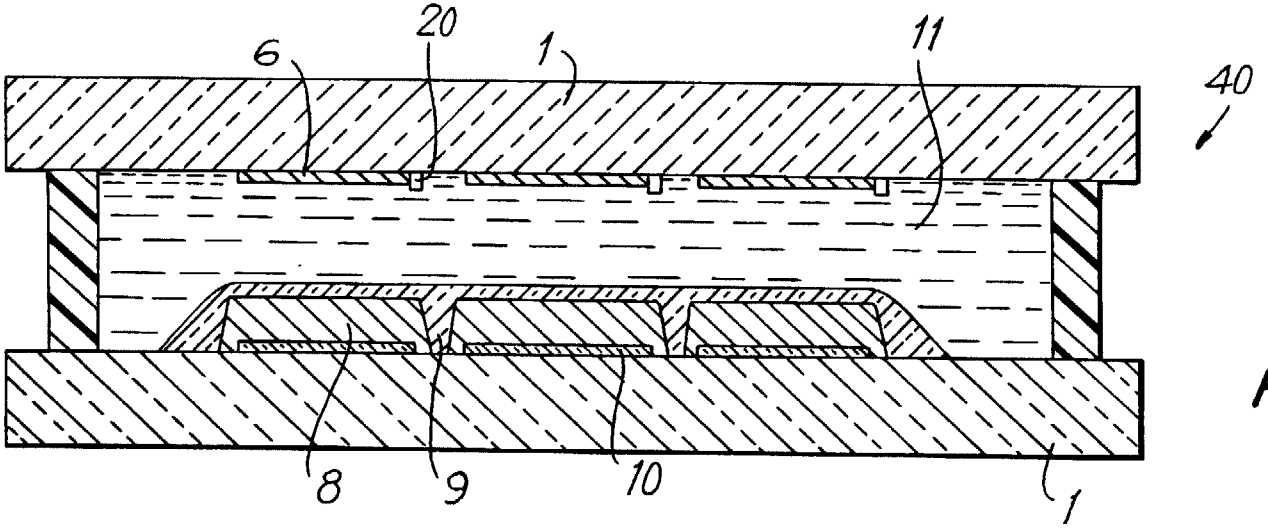
FIG. 10 is a sectional view showing the structure of a panel which includes color filters underlying the electrodes.

FIGS. 9 and 10 show typical liquid crystal display panel structures for a white mode display 30 and black mode display 40, respectively. Upon applying a voltage to a liquid crystal 11 in display panel 40 in FIG. 10, voltage drop occurs due to the presence of a color filter layer 10. Thus, the apparent capacitance of liquid crystal 11 is reduced because the capacitance of color filter layer 10 fails to reach the desired capacitance ratio. To counteract the reduced capacitance caused by color filter 10, black mode display 40 is chosen which is capable of obtaining a contrast of about 40 at a relatively lower voltage than white mode display 30.

The black mode display is simple in the panel structure, but has a drawback because the contrast is lower and the tone is poor compared to the white mode display. On the other hand, the white mode display generally has satisfactory tone and higher contrast, but requires higher driving voltage than the black mode display to obtain high contrast. However, since an inefficient white mode display such as shown in FIG. 10 may not be used in integrated circuits of the present-day technology, a panel structure having color filter 10 overlying electrodes 8 has to be adopted. Further, MIM display for white mode displays using color filters can provide high image quality at room temperature, but as it is exposed to high temperatures such as from the heat of back light during extended use, the contrast significantly decreases.

High contrast in both low and high temperature environments may be obtained even by the display shown in FIG. 2 by using a display constructed in accordance with the invention. This is attained by following the relationship:

$$C_{CF} \times C_{LC} / |(C_{CF}+C_{LC}) \times C_{MIM}| > 2$$

where $C_{CF}$ is the capacitance of the second substrate, $C_{LC}$ is the capacitance of the liquid crystal material, and $C_{MIM}$ is the capacitance of the metal-insulator-metal elements, and by making the specific dielectric constant $\epsilon$ of the insulator layer less than 30. Further, improved contrast has also been obtained even over a range of temperatures with the black display.

When driving the liquid crystals displays, if the liquid crystal contains much water, the Cr in the upper electrode in the MI element undergoes microscopic electrolysis which greatly deteriorates image quality. Specifically, where the surface of the insulating layer is uneven because of additional components other than oxidized Ta to the insulation layer, the insulating layer absorbs more water which causes deterioration in image quality. Therefore, the concentration of water in the cell must be controlled.

Other components can be added to the oxidized Ta in the insulating layer in order to lower the relative dielectric constant of the insulation layer and improve the liquid crystal display device properties such as the $\beta$ value, the temperature variation of the $\beta$ value, and R(3V). The preferred additional elements are Be, B, C, N, Mg, Al, Si, S, Ca, V, Cr, Mn, Fe, Co, Ni, Cu, Zn, Sr, Y, Cd, Sn, Ba, Pb, La, Ce, Nd, Sm, Eu, Gd, Dy, Ho, Er, Tm, Yb and Lu. The particularly preferred elements are Be, C, N, Mg, Al, Si and Cr which can be etched simultaneously as the metal layer Ta is patterned by chemical dry etching with $CF_4+O_2$.

Oxides, nitrides or oxynitrides can also be added to the insulation layer to reduce the relative dielectric constant of the insulating layer and thereby improve the $\beta$ value, the temperature variation of the $\beta$ value, and R(3V). The preferred materials include oxides, nitrides and oxynitrides of Be, Mg, Al, Si, Cr, Mn, Fe, Co, Ni, Cu, Sr, Y, Sn, Ba, La, Ce, Nd, Sm, Eu, Gd, Dy, Ho, Er, Tm, Yb and Lu. Those particularly preferred include Be, Mg, Al, Si and Cr which can be etched simultaneously with the metal layer.

Underlying insulation film 2 improves the bonding of MIM element 20 components (the combination of first metal layer 3, insulation layer 4 and second metal layer 5) to substrate 1, thereby decreasing the voltage in insulation layer 4. Moreover, with other material or components added to insulator layer 4, it is important to not expose the substrate during dry etching of first metal layer 3. If the substrate is dry etched, micro cracks are formed which tend to increase the adsorption of water and cause abnormalities in the contrast quality as described above. Any material which has the requisite qualities may be used as insulation layer 4. Those preferred include oxides, nitrides and oxnitrides of Be, Mg Sc, Ti, Cr, Mn, Fe, Co, Ni, Cu, Sr, Y, Zn, Mo, Sn, Hf, Ta, W, La, Ce, Pr, Nd, Sm, Eu, Gd, Dy, Ho, Er, Tm, Yb and Lu. Additionally, second Ca metal layer 5 electrode may possibley be disconnected at the end face of the display device. This occurs if the end face of the device is not appropriately tapered, or if underlying insulation film 2 is not etched, or if it is excessively etched when first Ta metal layer 3 is etched. Accordingly, the particularly preferred materials for insulating layer 2 are those materials which are properly etched by $CF_4$ and $O_2$ such as oxides, nitrides and oxynitrides of Be, Mg, Al, Si, Cr and Ta.

If the molar concentration of N added to $TaO_x$ in insulation layer 4 is less than 5%, the benefits such as the reduction of $\epsilon$ value and increase of $\beta$ value do not occur. In contrast, if the N molar concentration is more than 25%, the panel image quality can be further improved. However, the instability of the device quality is increased since the water content in the liquid crystal cell must be severely controlled. Accordingly, the preferred molar concentration of N in insulation layer 4 is between about 5 and 25%.

Additionally, when insulating layer 4 is formed by adding N and oxidizing first metal layer 3, if the N molar concentration in first metal layer 3 is not between about 5 and 45%, the N molar concentration in insulating layer 4 will not be between about 5 and 25% after oxidization. Moreover, the specific resistivity of Ta first metal layer 3 becomes greater than 300 μohm.cm thereby affecting the driving of the liquid crystal display and the resulting contrast.

When the N molar concentration in Ta first metal layer 3 is within a range between about 5 and 45%, the specific resistivity of Ta first metal layer 3 is within a range between 60 and 300 μohm.cm. The lowest resistance value for Ta is 60 μohm-cm for α-Ta, and the crystal structure of first metal layer 3 is either α-Ta or a mixture of α-Ta and $Ta_2N$ as seen in FIG. 5.

The invention will be described more specifically in the following examples which are set forth for purposes of illustration only and not in a limiting sense.

EXAMPLE 1

The basic steps for manufacturing an MIM element in accordance with the invention are detailed in FIGS. 3 and 4. FIG. 3 is a flow chart illustrating the fabrication steps, while FIG. 4(a)–(h) illustrate the cross-section of the MIM device for each step given in FIG. 3.

In FIG. 4(a), underlying insulation film 2 is formed on substrate 1. In this example, substrate is made of Ba borosilicate glass and underlying insulation film 2 is prepared by sputtering N-added Ta across substrate 1 to a thickness of 400 Å, which is then thermally oxidized into transparent N-$TaO_x$ insulation film 2.

In FIG. 4(b), N-added Ta metal layer 3 is sputtered over underlying insulation film 2 to a thickness of 3,500 Å. A resist (not illustrated) is formed by coating in a predetermined pattern and then patterned by chemical dry etching in $CF_4$ and $O_2$ gas into the shape of first metal layer 3, as shown in FIg. 4(c). After removing the resist, first metal layer 3 is anodized in an aqueous solution of citric acid as shown in FIG. 4(d) to form N-$TaO_x$ insulation layer 4 with a thickness of 600 Å.

Thereafter, Cr is sputtered to the upper surface as shown in FIG. 4(e) and, after forming resist (not illustrated) to a predetermined shape, etching is applied to form Cr second metal layer 5 as shown in FIG. 4(f). Then, the resist is removed and MIM element 20 is completed.

Next, ITO is sputtered as shown in FIG. 4(g) and etched by a similar fabrication as in FIG. 4(f), thereby forming picture element electrode 6 which contacts to Cr metal layer 5 at two points 6a and 6b.

FIG. 1 is a plan view illustrating one embodiment of MIM element 7 fabricated through the steps shown in FIG. 3. FIG. 2 is a cross-sectional view taken along line 2—2 of FIG. 1.

FIG. 5 is a graph which shows the relationship of the contrast of the liquid crystal display to the ratio of the capacitance of the MIM device and the capacitance of the picture element for a white mode display panel at room temperature. The capacitance ratio is varied by changing the relative dielectric constant ($\epsilon$) of insulation layer 4 by varying the amount of N added to Ta first metal layer 3 while keeping the film thickness of insulation layer 4 costant.

Usually, the $\epsilon$ value of $TaO_x$ is about 30. However, since appropriate capacitance ratio is not set (generally 1.6 as described), the contrast is as low as 50–60. The contrast improves and is saturated along with the reduction of the $\epsilon$ value. FIGS. 11 and 12 show the stability in the method of reducing the $\epsilon$ value. The graphical results in FIG. 11-(1) are obtained when a gas is introduced from an Ar-$N_2$ gas mixture cylinder adjusted to a chosen concentration into a sputter chamber for sputtering. Line (3) in FIG. 11 differs from line (1) in that Ar and $N_2$ are separately controlled for the flow rate by mass flowmeters and introduced and mixed in the sputtering chamber for sputtering, without using the gas mixture cylinder. In line (b 2), the sputtering gas is only Ar, but an N-added Ta target is used. As can be seen from FIG. 11, delicate control for the concentration of sputtered $N_2$ by the mass flowmeter is difficult and hard to reproduce. In contrast, the gas mixture cylinder and N-Ta target methods ar excellent since the degree of reduction for the $\epsilon$ value is identical and linear.

Another method of adding N into $TaO_x$ by N-plasma treatment after forming usual anodized $TaO_x$ without adding N has been tried and found to be less than satisfactory, because the difference in the polarity of the device I-V characteristic is increased. However, since this method has the advantage in that the $\epsilon$ value is reduced, the $\beta$ value is greatly increased and the resistance of the Ta metal layer is not increased, a device of satisfactory characteristics can be obtained by cancelling the polarity differences with an MIM element having layers of Ta/N - $TaO_x$/Cr/Ta/N - $TaO_x$ /Cr in which two MIM elements are connected in series.

In adition, in the results of the Si addition method shown in FIG. 12, Si-added Ta is sputtered and then anodized by a chip-on-target method of placing a Si chip on a Ta target, resulting in stable characteristics. The device characteristics upon improvement of the contrast was as follows: $\beta+\geqq 4.0$ ($B-\geqq 3.2$) (B+/B− shows the $\beta$ values when a positive/negative voltage is applied to Ta metal layer 3) at room temperature and $B+\geqq 3.5$ ($B-\geqq 2.7$) at 60° C. for the $\beta$ value, greater than $3\times10^{11}$ ohm at room temperature, and greater than $10^{10}$ ohm at 60° C., for R(3V) as shown in FIGS. 7 and 8. Further, upon analysis by Auger and ESCA, the N molar concentration in Ta metal layer 3 was 5–45% and the N molar concentration in the insulator layer was 5–25%. Higher N-concentration can provide further improvement for the image quality but increases the instability of the device characteristics. The N molar concentration of the N-added Ta target for satisfying the stability conditions was 5–50%.

The crystal structure of the lower Ta electrode was either $\alpha$-Ta or $\alpha$-Ta and $Ta_2N$. The specific resistivity was less than 300 μohm.cm. ESCA analysis showed that insulation layer 4 contains an oxynitride of $TaO_xN_y$ where x and y can be any number which form a stable compound. With a lower N-addition amount, the concentration of $TaO_xN_y$ was lower and the TaO concentration was higher, whereas with an appropriate N-addition amount and with satisfactory characteristics of $\beta$ value, temperature variations of $\beta$ value, and R(3V) characteristics, insulation layer 4 contained only $TaO_xN_y$. It can be deduced that whereas a great number of movable Ta ions are present due to lack of oxygen in the usual anodized film (the presence of which is shown by the presence of TaO as described above), the Ta ions are converted into $TaO_xNy$ by the introduction of N. Thus, the movable ions become fixed and thereby improve the $\beta$ value, R(3V), and so forth.

Further, if the polarity difference of the I-V characteristic of the device is not within the following range:

$$|\log(I/V)^- - \log(I/V)^+| \leqq 0.2$$

flicker occurs, but this flicker could be adjusted by heat treatment at 250° C. after the formation of the device.

The variation of film quality within the plane of substrate 1 was greatly improved when an RF bias was applied to substrate 1 after sputtering a combination of Ta, N and Si. The amount of N and Si is greater at the rotation center of substrate 1 when the bias is not applied, since the plasma density is higher at the center of substrate 1. However, since the plasma density is increased at the peripheral portion of substrate 1 by the RF bias application, scattering within the plane is decreased.

In this embodiment insulation layer 4 is formed by anodization, since anodization provides preferred stability for the film quality and film thickness. Particularly, where different elements are added as in this embodiment, their stability greatly contributes to the production yield. If the anodization film is formed by thermal oxidation or reative sputtering, the film stability is lessened, but a completely dry production process remarkably improves production output by means of the in-line system.

Also in this embodiment, different elements are added to Ta first metal layer 3, except in the case of N-plasma treatment, to increase the resistance of Ta metal layer 3. The size of insulation layer 4 can be increased to more than 20 inches using a method of applying sputtering while adding a slight amount of N in a sputtering atmosphere after forming the portion other than insulation layer 4 into a film, thereby forming α-Ta to reduce the resistance.

This embodiment can utilize the normally white mode display by including a color filter and an overlying MIM electrode. The display is formed by flattening the color filter layer with a Si-modified polymide and then forming a transparent ITO conductive film thereover. If the method of applying ITO wirings on a substrate and forming a pigment film by micell electrolysis thereover is used, the white mode display can be used in the underlying electrode structure without a large reduction of the liquid crystal application voltage, since the pigment has low $\epsilon$ value and since the pigments have gaps between each other. The contrast is the same as that of the color filter with overlying electrode. Additionally, the contrast and the contrast with temperature variances can be improved without using the normally white mode display.

EXAMPLE 2

An MIM device in which N is added to the insulation layer shows abnormal I-V characteristic as in curve (2) in FIG. 14 if N is not added, or if too little N is added to the underlying $TaO_x$ film. However, if N is added by an amount greater than a predetermined level to the underlying substrate, the device I-V characteristic has normal properties as shown in curve (1) of FIG. 13. (Curve (1) of FIG. 14). Since a thermally oxidized underlying film (Curve (2) of FIG. 14) provides a normal device with lesser amount of N-addition than a reactive underlying film (curve (1) of FIG. 14), if the etching rate is high, etching extends as far as the substrate upon dry etching of the Ta metal layer which causes microcracks in the substrate. These cracks increase both the adsorption of water and the unevenness of the insulator layer as described above, thus making the device characteristics abnormal. Moreover, the unevenness also increases on the surace of the N-added insulator layer which increases the adsorption of water. Therefore, the dry etching technique should not be used to remove the underlying layer in order to prevent the adsorption of more water. The water concentration in the panel cell is also important. The relationship between the water concentration in the cell and the N-added MIM element characteristics is shown in FIG. 15. If the water concentration in the cell is 100 ppm or less, the MIM element characteristics can be stabilized.

Underlying insulation films made of oxides, nitrides and oxynitrides of Al, Si, Cr, Be or Mg, as described above, perform satisfactorily like the $TaO_x$ underlying insulation film with the addition of the proper concentration of N.

The concentration of N in the $TaO_x$ insulator layer can be determined as an absolute amount by measuring the refractive index with an ellipsometer and evaluating the reflectivity by a spectrophotometer, as shown in FIG. 16. This instant feedback concerning the fluctuation of the production conditions can greatly improve the production yield. Other element concentrations in other insulation films also can be controlled by the same method.

EXAMPLE 3

The results of this exammple are shown in FIG. 17. When sputtering the Ta metal layer, an Ar atmosphere is usually applied. If the atmosphere also has N in a molar concentration of 12%, the relative dielectric constant of insulation layer 4 is reduced to one-half. N is introduced into the $TaO_x$ insulator layer to either increase $TaO_xN_y$ or make insulation layer 4 to be 100% $TaO_xN_y$.

Next, an N-doped MIM device 7 having the structure of MIM 20 sputtered with Ta by using the 12% $N_2$-Ar atmosphere is prepared as shown in FIG. 17. Since the device capacitance is one-half of the conventional device due to the atmosphere, a picture element 6' is bisected into two picture elements 6" to provide redundancy. When a black mode display liquid crystal panel was assembled by using the active MIM substrate to examine the optical characteristic, the panel contrast was increased by about 20 to 30% as compared with the undivided MIM panel. This increase can be attributed to the reduction of the device capacitance due to N-doping, as well as the increase of the β value showing the non-linearity of the device I-V characteristic ($I \alpha V \exp \beta \sqrt{V}$)) by about 20%. Further, the spot defects recognizable upon lighting up the panel caused no practical problem so that the yield of 100 panels was 98%. The high yield occurs because of the low probability that both of the bisected picture elements become defective, and since defects are not easily recognized when one of the elements is normal even if the other is defective. The number of picture elements divisions may also be increased to 4 or greater by further increasing the amount of N-doping and lowering the device capacitance. With the quadruple divisions, defects were not recognized at all.

MIM element 7 with the device capacitance reduced to one-half was prepared as shown in FIG. 17 by placing a required number of Si chips on the Ta target instead of N-addition. Since the device capacitance was one-half of the conventional device, the picture elements were also bisected to provide redundancy. When a normally black mode display liquid crystal panel was assembled by using the MIM substrate to examine the optical characteristic, the panel contrast was identical to that of the undivided MIM panel because the capacitance ratio between the device and the liquid crystal remained constant and the device I-V characteristics did not change due to the Si addition. Spot defects recognized upon lighting up the panel caused no practical problem and the yield of 100 panels was 98%. Again, the high yield occurs because of the low probability that both of the bisected picture elements become defective, and the difficulty of detecting a defect if one of the elements is normal even if the other is defective. The number of picture element divisions was also increased to 4 or greater by further increasing the Si-doping amount and lowering the device capacitance. In these cases, no defects were recognized.

EXAMPLE 4

The fabrication process for MIM devices in accordance with this embodiment is shown in FIG. 3. After sputtering a Ta film on substrate 1 made of Ba borosilicate glass to 400 Å thickness in a nitrogen-containing atmosphere by reactive sputtering, the Ta film was thermally oxidized at 500° C. in ordinary air to form underlying insulation film 2.

Next, Ta first metal layer 3 was formed on underlying insulation film 2 in a nitrogen-containing atmosphere to a thickness of 3500 Å by reactive sputtering. The thus formed Ta metal layer 3 was formed by chemical dry etching in $CF_4$ and $O_2$, thereby undergoing pattern etching.

After anodizing the pattern-etched Ta metal layer 3 in an aueous 1% solution of citric acid to form insulation layer 4 of 600 thickness, Cr metal layer 5 was formed to 1500 Å thickness on the thus formed insulation layer 4. Cr metal layer 5 wa then patterned etched, and layers 3, 4 and 5 thus formed MIM element 20.

An ITO film was formed next, which was etched to prepare picture element electrode 6. In this example, the amount of N added to Ta metal layer 3 was changed by varying the $N_2$ concentration in the sputtering atmosphere, thereby varying the relative dielectric constant of insulation layer 4 to below 30. Then, a liquid crystal panel for a normally white mode display was prepared by combining a MIM device substrate 31 with a second substrate including an overlying electrode color filter layer structure 32 as shown in FIG. 9. The relationship between the panel contrast and the capacitance ratio of MIM element 7 to picture element liquid crystal between opposed electrodes is shown in FIG. 5. FIG. 5 also shows the crystal structure and specific resistivity of Ta metal layer 3.

FIG. 6 shows the temperature characteristics of contrast when varying the $\epsilon$ value. FIG. 7 shows the temperature characteristics of the $\beta$ value when varying the $\epsilon$ value. FIG. 8 shows the temperature characteristics upon applying a 3V voltage R(3V) when varying the $\epsilon$ value. As can be seen from FIG. 6, a contrast of 85 can be secured even at 60° C. if the $\epsilon$ value is 22 or less. The contrast of a TFT panel is generally greater than 100. Since a difference in contrast above 70–80 cannot be clearly distinguished from that of the TFT by the human eye, a contrast comparable to that of the TFT panel can be obtained only if the $\epsilon$ value is 22 or less. Moreover, although both the $\beta$ value and R(3V) show satisfactory values at $\epsilon$=26, the panel contrast is poor at 60° C. This is due to the fact that the capacitance ratio is as low as 1.9.

The contrast is extremely good even at $\epsilon$=23 which is attributable to the good temperature characteristic of R(3V) and $\beta$ value. However, this data is obtained only when sputtering is applied by a 50B sputtering device manufactured by Tokuda Seisakusho. With more data obtained by using a 4ES device manufactured by Tokuda Seisakusho and an Anerba 530H device manufactured by Nichiden Anerba Co., the optimum conditions for obtaining the contrast comparable with that of TFT panel was $\epsilon \leqq 22$. From these results, it can be determined that a contrast comparable with that of the TFT panel can be obtained if $\epsilon \leqq 22$ and the capacitance ratio is greater than 2. It is possible to improve contrast, for example, if ($22 \leqq \epsilon < 30$) by use of the redundant design for the bisection of a picture element where $\epsilon \leqq 10$. In addition, since the capacitance ratio of the bisected picture element and the device of greater than 2 can be ensured, contrast comparable to the TFT panel can be obtained. Alternatively, in the situation where only the contrast of a conventional MIM panel is required, a one inch panel containing 50,000 picture elements can be prepared. Such panels may be used in view finders and other devices which had heretofore not been practical.

EXAMPLE 5

A glass substrate (7059, Ba borosilicate glass, manufactured by Corning Co.) was cleaned and then sputtered with Ta in a $N_2$-containing atmosphere. The Ta film was thermally oxidized to form an underlying insulation film. A Ta film was formed on the underlying insulation film. Sputtering was performed under conditions of $1.5\times10^{-2}$ Torr gas pressure and 1.5 KW power with a sputtering gas of Ar and $N_2$. The gas pressure for $N_2$ and Ar was 3% and 97%, respectively. The film thickness was 2500 Å.

In an identical chamber, a Ta film was continuously sputtered to 500 Å thickness while the $N_2$ gas partial pressure was maintained at 10% and Ar gas partial pressure at 90%. Thereafter, Ta was patterned to a predetermined size using photolithographic etching, which was easily accomplished using $CF_4$ 60% and $O_2$ 40% gas.

An oxidized film was formed by an anodization method using an aqueous 1% solution of citric acid. Since Ta nitride film was present in a thickness of 500 Å on the surface of the Ta sputtered film, it actually formed a composite insulation film of oxynitride film.

Next, Cr was sputtered with Ar pressure at $2\times10^{-2}$ Torr and power at 2 KW. The final thickness was 1500 Å. The Cr film was patterned to a predetermined shape by photolithography. A picture element electrode was then formed by sputtering ITO and patterning to a predetermined shape by photolithography. The thickness was 1000 Å.

The specific resistivity of the Ta metal layer measured at $1.0\times10^{-4}$ ohm.cm, and thus the resistance was lowered at about 50 to 10% as compared with conventional MIM elements.

A liquid crystal panel including a plurality of MIM elements coupled to picture electrodes was assembled to confirm the image quality. The image quality was clear with no stain or unevenness.

The effectiveness of the MIM devices formed in accordance with the invention including a TaN electrode can be confirmed by comparison with a panel having a Ta electrode. The Ta electrode panel provides poorer image picture quality due to unevenness between the areas nearer to and remote from the connection terminals of the external power supply.

Finally, the crystal structure of the Ta metal layer when sputtered under the foregoing sputtering conditions was confirmed by X-ray diffractiometry for the crystal structure. The peak X-ray diffractiometry was also the peak of $\alpha$-Ta.

EXAMPLE 6

A Ta film for the lower electrode was formed on a barium borosilicate glass 7059 manufactured by Corning Co. by using a sputtering device.

Ar and $N_2$ gases were used as the sputtering gas. The total gas pressure was set to $2\times10^{-2}$ Torr, in which the $N_2$ gas was 0%, 2%, 5%, 10%, 15%, 20%, 25% and 28%, respectively by adjusting the partial pressure. Heating was maintained at a constant temperature of 180° C. The sputtering film thickness was controlled to 2800 Å in each case by adjusting spttering time. The sputtering power was set to 1.5 KW.

Ta was then patterned to a predetermined shape using a chemical dry etching device in an atmosphere of 60% $CF_4$ and 40% $O_2$. An oxidized film was then formed by anodization using an aqueous 1% solution of citric acid to form the "I" of the MIM. Since this insulation layer contained N as well, it is actually an oxynitride film. When the nitrogen in the insulation layer was analyzed by an ion microanalyzer (IMA), optoelectronic analyzer (XPS) and Auger analyzer (AES), the following contents were determined as shown in Table 1.

The thickness of the insulation layer was set at 600 Å. Next, Cr was sputtered while controlling Ar pressure at $2\times10^{-2}$ Torr and the power at 2 KW. The thickness was set at 1500 Å.

A Cr metal layer was patterned to a predetermined shape using photolithographic etching. Further, a picture element electrode was formed by sputtering ITO which wa then patterned to a predetermined shape by photolithography. The thickness was set at 1000 Å.

The size of the resulting MIM element was 5 μm×4 μm.

Table 1 shows the capacitance and the resistance of the MIM element under a voltage of 10V. The capacitance was a value of 10 KHz, which was measured by an LCR meter.

Additionally, a normally black mode liquid crystal display panel was assembled using the MIM substrate, and the contrast ratio was measured. The results are also shown in Table 1.

TABLE 1

| $N_2$ sputter gas partial pressure | N content (at %) IMA | XPS | AES | Capacitance | Resistance (Ω) (10 V) | Contrast ratio |
|---|---|---|---|---|---|---|
| 0% | 0 | 0 | 0 | 3.8 nF/mm² | $2\times10^9$ | 1:30 |
| 2% | 3.2 | 3.0 | 3.1 | 3.7 nF/mm² | $4.5\times10^9$ | 1:35 |
| 5% | 5.3 | 5.6 | 6.3 | 3.2 nF/mm² | $5.3\times10^9$ | 1:60 |
| 10% | 7.8 | 8.3 | 8.7 | 2.5 nF/mm² | $5.6\times10^9$ | 1:70 |
| 15% | 14.7 | 13.2 | 14.6 | 2.0 nF/mm² | $6.1\times10^9$ | 1:80 |
| 20% | 21.2 | 20.8 | 19.7 | 1.5 nF/mm² | $6.3\times10^9$ | 1:90 |
| 25% | 23.6 | 22.4 | 24.1 | 1.0 nF/mm² | $6.5\times10^9$ | 1:95 |
| 28% | 28.3 | 26.4 | 28.5 | 0.5 nF/mm² | $3.2\times10^9$ | 1:35 |

As shown in Table 1, an MIM element with a molar concentration of N in the insulator layer less than 5% provides insufficient contrast ratio. Also, an MIM element with a molar concentration of N in the insulator layer greater than 25% also does not provide sufficient contrast, probably due to the high resistance of the device and the specific resistivity of N-added Ta greater than 300 μohm.cm. The contrast can be improved by increasing the driving voltage, but it involves a solution such as special IC production or an alternating driving circuit. Thus, MIM elements containing a molar concentration of N in the insulation layer between about 5 and 25% show increased contrast.

EXAMPLE 7

N was sputtered onto Ba borosilicate glass 7059, manufactured by Corning Co., by using Ta targets with an N concentration of 0, 3, 5, 10, 20, 30, 40, 50, 55 and 60%, respectively. Sputtering was applied at an Ar gas pressure of $2\times10^{-2}$ Torr, a substrate temperature of 150° C. and a sputtering power of 1.5 KW. The Ta metal layer constituting the lower electrode of the MIM was examined for its crystal structure by X-ray diffractiometry.

The results are shown in Table 2.

TABLE 2

| molar % N in Ta target | Crystal structure |
|---|---|
| 0 | β-Ta |
| 3 | β-Ta |
| 5 | α-Ta |
| 10 | α-Ta + $Ta_2N$ |
| 20 | α-Ta + $Ta_2N$ |
| 30 | α-Ta + $Ta_2N$ |
| 40 | α-Ta + $Ta_2N$ |
| 50 | α-Ta + $Ta_2N$ |
| 55 | TaN |
| 60 | TaN |

As shown in Table 2, the crystal structure is stable within the range of 10–50 molar % N in the Ta target.

Next, the Ta metal layer was formed to predetermined shape by photolighographic etching and then anodized with an aqueous 1% solution of citric acid. The insulation layers contained Ta oxynitride as shown by XPS analysis except for those prepared from a Ta target with a 0% concentration of N. The thickness was confirmed to be about 600 Å by examining peaks for 0 while etching with IMA.

Cr was then sputtered and formed by a photolithographic etching to a predetermined shape, and then ITO was formed as a picture element electrode in the same manner as in the prior art.

The capacitance was measured using an LCR meter. Table 3 shows the results of measuring the specific resistance of the TA metal layer by means of a 4-terminal measuring method.

TABLE 3

| molar % N in Ta target | Capacitance (nF/mm²) | Specific resistivity ($\times10^{-4}$ Ω cm) |
|---|---|---|
| 0 | 3.9 | 2.3 |
| 3 | 3.6 | 2.0 |
| 5 | 3.2 | 1.0 |
| 10 | 3.0 | 1.5 |
| 20 | 2.8 | 2.0 |
| 30 | 2.2 | 2.0 |
| 30 | 1.6 | 2.1 |
| 50 | 1.0 | 2.2 |
| 55 | 0.7 | 3.2 |
| 60 | 0.5 | 3.9 |

The size of the MIM element was 5 μm×4 μm and the thickness of the insulator layer was 600 Å.

A liquid crystal panel was completed by using this substrate. The image quality of this panel was compared to an MIM panel obtained by sputtering Ta in an Ar and $N_2$ atmosphere in which the $N_2$ and the Ar partial pressures were controlled by a mass flow meter, and then anodizing the Ta metal layer.

The panels having 0 and 3% molar concentration of N had a contrast ratio of 1:30, and panels using Ta targets with a 5–50% molar concentration of N had contrast ratios of 1:50, 1:70, 1:75, 1:80, 1:90 and 1:95, respectively. The panels using the Ta targets with a 55 and 60% molar concentration of N had contrast ratios of 1:80 and 1:50, respectively. A Ta-sputtered panel in Ar and $N_2$ gas L- had a contrast ratio of 1:100 but unevenness or stains were formed on the picture as a whole. Thus, it can be assumed that the device characteristics were varied since the quality of the device was not uniform.

The panels using the Ta targets with 55 and 60% molar concentration of N showed differences in the image quality between the areas nearer to and remote from the connection terminals of the external power supply, and these differences caused unevenness. The differences can be attributed to the fact that the specific resistivity was as high or greater than 300 μohm.cm and an insufficient voltage was applied to the remote picture elements due to the voltage drop.

EXAMPLE 8

Ba borocilicate glass 7059, manufactured by Corning Co., wa cleaned with hot sulfuric acid at 80° C. and further washed with water to be used as a substrate. A Ta film was sputtered on the substrate using a sputtering device in an Ar and $N_2$ gas at a partial pressure of $1.8\times10^{-2}$ Torr and $2\times10^{-3}$ Torr, respectively. The sputtering continued until the thickness was 500 Å. When the Ta film was examined by X-ray diffractiometry, the presence of Ta nitrates such as TaN and $Ta_2N$ was confirmed.

The Ta film was thermally oxidized at 430° C. for 4 hours in ordinary air. The glass substrate removed from the furnace appeared transparent with a 90% transmission which was sufficiently transparent. The resulting underlying insulating layer was analzed by an optoelectronic analyzer (XPX) and O, N and Ta were detected, thus confirming that an oxynitride film of Ta was formed.

A Ta metal layer for the lower electrode was formed by sputtering in an $N_2$-containing atmosphere and fabricated into a predetermined shape by photolithographic etching. The etching was carried out using a DCE device (dry etching device) manufactured by Tokuda Seisakusho and in a controlled gas containing 60% $CF_4$ and 40% $O_2$ partial pressure at a flow rate of 350 SCCM.

The uniform distribution of N and Ta within the surface of the etched substrate was confirmed by XPS in the same manner that oxynitride was earlier confirmed in the underlying insulating film. By comparison, in an underlying insulating film with no N-addition, Ta was not uniformly distributed and, after the etching of the Ta metal layer, those portions of the underlying insulating film had been etched away as well.

Afterwards, the patterned Ta was formed into the TaOx insulation layer of the MIM element by anodization of the Ta metal layer using an aqueous 1% solution of citric acid. The thickness of the oxide film was about 500 Å when measured by an ellipsometer.

Next, a Cr film was sputtered in the same manner as in the conventional MIM element until the thickness was 1500 Å. The Cr metal film was patterned to a predetermined shape using a resist and then etched by using MPM-E30 manufactured by Moroboshi Ink Co. The picture element electrode was formed by sputtering and then etching ITO to a predetermined shape with an aqueous 20% solution of sulfuric acid and hydrochloric acid using photolithography.

When the current-voltage property of the MIM element in accordance with this Example was measured, the β value (for current value between 6V–8V) was within the scattering range from 4.2 to 4.5 among each of the substrates.

There was no disconnection of the Cr metal layer at the tapered portion, and therefore there was no yield reduction due to such Cr disconnection.

EXAMPLE 9

Ba borosilicate glass 7059, manufactured by Corning Co., was cleaned with a hot sulfuric acid at 80° C. and a Ta metal layer was formed by sputtering using a sputtering device in Ar gas including 15% $N_2$. When the Ta metal layer was inspected with X-ray diffractiometry, it contained Ta (α-structure) and $Ta_2N$. Generally, Ta film has β-structure Ta. When the specific resistivity was measured, the Ta metal layer in accordance with the invention had a specific resistivity of $2.2\times10^{-4}$ ohm.cm. Thus, the specific resistivity of the Ta metal layer made in accordance with the invention is substantially the same as the Ta metal layer made with without and N-addition. The Ta metal layer was then patterned to a predetermined shape by photolithographic etching with a gas containing 60% $CF_4$ and 40% $O_2$.

An insulation film was formed by anodization of the Ta metal layer using an aqueous 1% solution of citric acid. Although the structure of the insulation film could not be confirmed by X-ray diffractiometry since the structure was amorphous, XPS analysis showed a binding energy peak confirming the presence of Ta oxynitride. In addition, peaks for TaO and TaN were also present.

A Cr metal layer was formed by sputtering Cr to a thickness of 1500 Å. The Cr was patterned to a predetermined shape by photolithographic etching. A picture element was then formed by sputtering and then patterning ITO to a predetermined shape using photolithography. The Cr metal layer was 1000 Å thick.

The area of the device was 5 μm×4 μm and the thickness of the Ta oxynitride was measured by an ellipsometer to be 600 Å thick. The capacitance of the MIM element made in accordance with the invention was measured using an LCR meter at optional 100 points, and was found to be 2.7 $nF/mm^2$, which is ⅔ of the ⅜ $nF/mm^2$ found in conventional MIM elements.

A normally white mode liquid crystal display panel was assembled using a MIM substrate prepared in accordance with this Example to confirm the image quality. The contrast ratio was 1:100, a considerable improvement over the 1:60 ratio of conventional MIM panels. Moreover, when the amount of N in the Ta metal layer was changed such that the resulting insulator layer contained only Ta oxynitrite, the β value was as high as 5 and the panel contrast increased to 150:1.

Finally, a liquid crystal panel in which the Ta metal layer of the MIM's contained only Ta nitride (TaN) was assembled and driven for comparison. This panel showed a difference in image quality between the areas near to or far from the connection terminals of the external power supply resulting in unevenness.

EXAMPLE 10

Ba borosilicate glass 7059, manufactured by Corning Co., was cleaned with hot sulfuric acid at 80° C. A Ta metal layer was formed to a thickness of 2800 Å using a sputtering device and Ar gas at a pressure of $1.5\times10^{-2}$ Torr and power at 1.5 KW. The Ta metal layer was patterned to a predetermined shape using photolithographic etching. The etched Ta film of the device was 5 μm in width.

The insulation layer of the MIM element was formed by anodization of the Ta metal layer using an aqueous 1% solution of citric acid. The initial voltage was set at 32 V and the thickness of the insulation layer was 500 Å as measured with an ellipsometer.

The anodized substrate was treated in a plasma etching device (DEM451, manufactured by Nichiden Anerba Co.) with a plasma treatment at an $N_2$ gas at a pressure of $2\times10^{-2}$ Torr. Power was set at 500 W at RF. When the substrate was analyzed with an optoelectron analyzer, peaks for TaO, TaN and Ta oxynitrides were detected, confirming that the insulating layer contained N-added Ta oxides.

Next, Cr was sputtered in Ar gas at a pressure of $2\times10^{-2}$ Torr and a power of 2 KW until the Cr metal layer was 1500 Å thick. The Cr metal layer was patterned to a predetermined shape (4 μm at the MIM element) by using lithographic etching. A picture element was formed by sputtering and patterning ITO into a predetermined shape by photolithography to a thickness of 1000 Å.

When the current-voltage characteristics of the MIM device substrate was confirmed at an optional 100 positions, the electric current flowing upon application of 10 V was from $2\times10^{-1}$ A to $3.5\times\ ^{-9}$ A. It can be seen that the deviations among the MIM devices made in accordance with this Example is far less than the MIM elements with Ta metal layers prepared with anodization by sputtering Ta in Ar and $N_2$ gas at a flow rate controlled by a mass flow meter have a current-voltage characteristic which varies from $5\times10^{-8}$ A to $1\times10^{-10}$ A. In addition, the β value for the MIM devices in this Example was very high (β=9). Since a polarity difference was present in the I-V characteristic, two MIM elements were connected in series to cancel the polarity difference. The capacitance of the MIM devices of the Example was within a range from 2.5 to 2.7 nF/mm$^2$.

When a display panel was assembled to test the image quality, clear image quality was obtained without so-called stain or unevenness in the image. The effectiveness of the MIM's of this Example were confirmed by comparison with a display panel which has MIM devices in which the Ta metal layer was formed in Ar and $N_2$ gas. This latter panel showed differences in the image quality due to unevenness between areas near to and far from the external power source. Only in a very large-sized substrate such as over 300 mm$^2$ was any scattering observed which may be attributable to the scattering of the plasma density.

EXAMPLE 11

Ba borosilicate glass 7059, manufactured by Corning Co., was cleaned with hot sulfuric acid at 80° C. as a substrate N-added TaOx was sputtered on the substrate using a DC magnetron sputter at 2 KW and an applied RF bias of 100 W. The sputtering gas was 37 SCCM of gas from a gas mixture cylinder containing 15% $N_2$ and 85% Ar and 87 SCCM of gas from an $O_2$ gas cylinder introduced into a flow rate control chamber. The resulting underlying insulation layer was sputtered to a thickness of 600 Å using a DC magnetron sputterer at 2KW and an applied RF bias of 100 W.

An N-Ta metal layer for the lower electrode was formed to 3500 Å thickness using the gas mixture cylinder containing 15% $N_2$ and 85% Ar used to form the underlying insulation layer at a flow rate of 60 SCCM. A DC magnetron sputter with 2 KW was used and RF bias of 100 W was applied to the substrate to be sputtered. The N-Ta metal layer had a crystal structure of α-Ta and $Ta_2N$ and a specific resistivity of 220 μohm.cm.

A predetermined pattern was formed on the N-Ta metal layer using a photoresist OFPR-800 and the N-Ta film was pattern-etched to the lower electrode by a chemical dry etching method. Chemical dry etching was applied using a CDE device manufactured by Tokuda Seisakusho and a controlled flow rate of a gas comprising 60% $CF_4$ and 40% $O_2$ partial pressure to 350 SCCM.

Next, the patterned substrate was immersed in an aqueous 1% solution of citric acid and anodized under a voltage of 32V to form the insulation layer of the MIM element to a thickness of 600 Å. A Cr metal layer was then formed to 1500 Å using a sputtering device. The Cr metal layer was patterned to a predetermined shape using photoresist and etched by using MPM-E30 manufactured by Moroboshi Ink Co. into an upper electrode.

A picture element electrode was formed by sputtering ITO to a thickness of 1000 Å and etched to a predetermined size by using an aqueous 20% solution of nitric acid and hydrochloric acid using photolithography to prepare a substrate for the MIM element.

A second opposed substrate of a Ba borosilicate glass Pyrex 7059, manufactured by Corning Co. was formed as follows. Dyed color filter layers of red, green and blue were selectively formed on the substrate. A layer of silicon-modified polyamide was coated over the filters and baked to flatten the color filter layers. Wiring electrodes were prepared by sputtering ITO on the substrate and pattern etching the ITO.

The first and second opposed substrate (MIM element substrate and color filter substrate) were immersed in an aqueous 0.1% solution of aminosilane SH6020 (manufactured by Nippon Soda Co.), cleaned, baked at 180° C., and then rubbed for orientation treatment. The two substrates were joined to each other using a thermosetting epoxy resin containing glass fibers of 6 μm diameter as the sealing material and cell gap maintaining member, and press bonded at 150° C. for 3 hours to obtain a liquid crystal cell. Liquid crystal material was injected and sealed in the liquid crystal cell by vacuum sealing. The liquid crystal materials used in this particular example were PCH (phenyl cyclohexane) liquid crystal ZLI-1695, manufactured by Merck Co. The liquid crystal display device was completed by placing a polarizer plate on the upper surface and another polarizer plate on the lower surface of the liquid crystal cell.

When the liquid crystal display device was driven at 1/480 duty, a contrast of higher than 100 was obtained in temperatures ranging from room temperature to 60° C.

As has been described above, in an active matrix type liquid crystal display device including a plurality of row electrodes disposed on a first substrate and a plurality of column electrodes disposed on an opposed second substrate disposed in perpendicular to the row electrodes, and non-linear switching resistance elements each disposed between each picture element portion in a matrix-like pattern at each intersection between both of the electrodes and in which liquid crystal material sealed between both of the substrates is electrically driven to provide a display, a 2-terminal MIM device (metal- insulator-metal) is used as the non-linear resistance device. The relative dielectric constant of the insulator is less than 30, and the capacitance $C_{CF}$ of the opposed substrate, capacitance $C_{LC}$ of liquid crystal in the picture element portion and the capacitance $C_{MIM}$ of the MIM device follow the relationship:

$$C_{CF}\times C_{LC}/[(C_{CF}+C_{LC})\times C_{MIM}]>2$$

A method of manufacturing the active matrix type liquid crystal display device has also been described above. The method includes a first step of reactive-sputtering a Ta film on the substrate in a nitrogen-containing atmosphere and then oxidizing the Ta film to form an underlying insulation film, a second step of reactive sputtering a Ta film on the underlying insulation film in a nitrogen-containing atmosphere, a third step of pattern etching the Ta film formed in the second step thereby forming a lower electrode, a fourth step of oxidizing the pattern etched Ta film into an insulation film (insulator), a fifth step of forming a Cr film on the insulation film formed in the fourth step, a sixth step of pattern etching the Cr film formed in the fifth step into an upper electrode thereby forming a MIM device, a seventh step of forming an ITO film after the sixth step and an eighth step of etching the ITO fillm into a picture element electrode.

The picture quality of a display device containing an MIM element, which has heretofore been inferior with a display device containing a TFT devices, has been remarkably improved to be equal to or even superior to that of the TFT-containing display device. Moreover, utilizing the redundant design for the division of the picture element, the production yield of the MIM-containing display devices can be greatly increased, making the production cost of the MIM-containing display device comparable to the TFT-containing display device. Additionally, the production of a small-sized display of about one-inch size, heretofore considered impossible, has now been achieved. Likewise, specific resistivity as low as 60 μohm.cm can now be obtained by controlling the crystal structure of the lower metal layer, which is important in large-sized displays of greater than 20 inches. Thus, for the first time MIM-containing display devices can be used for large-sized display devices by use of the redundant design, reducing the resistance of the wiring, and rapid feedback and alteration of the insulator layer quality during the sputtering process.

It will thus be seen that the objects set forth above, among those made apparent from the preceding description, are efficiently attained, and certain changes may be made in the above construction and steps without departing from the spirit and scope of the invention. It is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. An active matrix liquid crystal display device, comprising:

(a) a first active substrate with a plurality of spaced apart row electrodes disposed on the first substrate;

(b) a second substrate with a plurality of column electrodes disposed on a second opposed substrate spaced apart from the first substrate to form a space therebetween, wherein the column electrodes oppose the row electrodes and are perpendicular thereto with a plurality of picture elements arranged in a matrix-like pattern of columns and rows at the intersections of the electrodes;

(c) a plurality of non-linear resistor switching elements, one disposed on one of the substrates adjacent to each picture element electrode and electrically connecting the picture element electrodes to the electrodes; and (d) a liquid crystal material located in the space between the first and second substrates;

wherein the non-linear resistor switching elements are metal-insulator-metal two-terminal elements having an insulation layer disposed between two metal layers, the relative dielectric constant of the insulation layer is less than 30, and the capacitance $C_{CF}$ of the second substrate, the capacitance $C_{LC}$ of the liquid crystal material, and the capacitance $C_{MIM}$ of the metal-insulator-metal elements is governed by the relationship:

$$C_{CF}\times C_{LC}[(C_{CF}+C_{LC})\times C_{MIM}]>2.$$

2. The active matrix liquid crystal display device of claim 1, further including a color filter layer disposed on the column electrodes on the second substrate and wherein $C_{CF}$ is the same as the capacitance of the color filter layer.

3. The active matrix liquid crystal display device of claim 1, further including a color filter layer disposed on the second substrate, the column electrodes on the color filter layer, and wherein the $C_{CF}$ is the same as capacitance of the color filter layer which approaches a value of ∞.

4. The active matrix liquid crystal display device of claim 1, further including driving means for driving the active matrix liquid crystal display device in a normally black display mode or a normally white display mode.

5. The active matrix liquid crystal display device of claim 1, wherein the concentration of water in the liquid crystal material is less than 100 ppm.

6. The active matrix liquid crystal display device of claim 1, wherein the metal-insulator-metal two-terminal elements include a first metal layer on the substrate, an insulation layer formed on the first metal layer and a second metal layer on the insulating layer.

7. The active matrix liquid crystal display device of claim 6, wherein the first metal layer is Ta, the insulation layer is A-$TaO_x$ with x being any number which forms a stable oxide of Ta, and A is at least one additional component which is capable of lowering the relative dielectric constant of the insulation layer to less than the relative dielectric constant of $TaO_x$, and the second metal layer is Cr.

8. The active matrix liquid crystal display device of claim 7, wherein the relative dielectric constant of the insulation layer is ≦22.

9. The active matrix liquid crystal display device of claim 7, wherein the relative dielectric constant of the insulation layer is ≦10.

10. The active matrix liquid crystal display device of claim 7, wherein the additional component in the insulation layer is N or Si.

11. The active matrix liquid crystal display device of claim 10, wherein the insulating layer further includes an oxidated Ta and N derivative.

12. The active matrix liquid crystal display device of claim 7, wherein the additional component in the insulation layer is an oxide, nitride or oxynitride of Ta.

13. The active matrix liquid crystal display device of claim 7, wherein the crystal structure of the Ta first metal layer is α-Ta.

14. The active matrix liquid crystal display device of claim 7, wherein the additional component is N in a molar concentration of between about 5 and 25%.

15. The active matrix liquid crystal display device of claim 7, wherein each picture element electrode at the intersection of the row and column electrodes is divided into at least sections, and wherein metal-insulator-metal two-terminal element couples each picture element electrode section to the line electrode.

16. The active matrix liquid crystal display device of claim 15, wherein the additional component in the insulation layer of the metal-insulator-metal element is N or Si.

17. The active matrix liquid crystal display device of claim 7, wherein the Ta first metal layer includes nitrogen at a molar concentration of between about 5 and 45%.

18. The active matrix liquid crystal display device of claim 17, wherein the crystal structure of the Ta first metal layer is a mixture of α-Ta and $Ta_2N$.

19. The active matrix liquid crystal display device of claim 17, wherein the specific resistivity of the Ta first metal layer is between 60 and 300 μohm.cm.

20. The active matrix liquid crystal display device of claim 6, including an insulation film of oxide, nitride or oxynitride formed on the first active substrate, the metal-insulator-metal two-terminal element formed on the insulation film.

21. The active matrix liquid crystal display device of claim 20, wherein the oxynitride film formed on the substrate is Ta oxynitride.

22. A metal-insulator-metal element in an acitve matrix substrate, comprising:

a substrate;

an insulating underlying film including N-$TaO_x$ on the substrate, wherein x is any number such that $TaO_x$ is a stable oxide of Ta;

a first metal film of one of Ta and N-Ta on the underlying film;

an element insulation layer on the first metal film, the insulation layer including N-$TaO_x$ having 5 to 25 atomic % N; and a second metal film on the element insulation layer.

23. The metal-insulator-metal element of claim 22, wherein the first metal film includes N-Ta including about 5 to 45 atomic percent N.

24. The metal-insulator-metal element of claim 23, wherein the second metal film includes Cr.

*25. A matrix liquid crystal display device, comprising:*

*(a) a first substrate and a plurality of first electrodes supported by the first substrate;*

*(b) a second substrate with a plurality of second electrodes supported thereby spaced apart from the first substrate to form a space therebetween, wherein the first electrodes oppose the second electrodes and a plurality of picture element electrodes are arranged in a matrix-like pattern on one of said substrates at the intersections of the first and second electrodes;*

*(c) a plurality of two-terminal switching elements, supported by the same substrate as the picture element electrodes, each of the two-terminal switching elements being coupled to one of the picture element electrodes for electrically connecting each of the picture element electrodes to one of the first or second electrodes; and*

*(d) a liquid crystal material located in the space between the first and second substrates;*

*wherein the two-terminal switching elements are constructed with a non-linear resistor layer disosed between two conductive portions and the capacitance $C_{CF}$ of the second substrate, the capacitance $C_{LC}$ of the liquid crystal material, and the capacitance $C_{MIM}$ of the two-terminal switching elements is governed by the relationship:*

$$C_{CF}\times C_{LC}/[(C_{CF}+C_{LC})\times C_{MIM}]>2.$$

*26. The matrix liquid crystal display device of claim 25, further including a color filter layer supported by the one of the first or second electrodes and wherein $C_{CF}$ is the same as the capacitance of the color filter layer.*

*27. The matrix liquid crystal display device of claim 25, further including a color filter layer supported by one of the first or second substrates, the first or second electrodes being on the color filter layer, and wherein the $C_{CF}$ is the same as the capacitance of the color filter layer which approaches a value of infinity.*

*28. The matrix liquid crystal display device of claim 25, further including driving means for driving the matrix liquid crystal display device in a normally black display mode or a normally white display mode.*

*29. The matrix liquid crystal display device of claim 25, wherein the concentration of water in the liquid crystal material is less than 100 ppm.*

*30. The matrix liquid crystal display device of claim 25, wherein the two-terminal switching elements include a first conductive portion supported by the substrate, a non-linear resistor layer on the first conductive portion and a second conductive portion on the non-linear resistor layer.*

*31. The matrix liquid crystal display device of claim 30, wherein the non-linear resistor layer is A-$TaO_x$ with x being any number which forms a stable oxide of Ta, and A is at least one additional component which is capable of lowering the relative dielectric constant of the non-linear resistor layer to less than the relative dielectric constant of $TaO_x$.*

*32. The matrix liquid crystal display device of claim 31, wherein the relative dielectric constant of the non-linear resistor layer is <30.*

*33. The matrix liquid crystal display device of claim 31, wherein the relative dielectric constant of the non-linear resistor layer is ≦22.*

*34. The matrix liquid crystal display device of claim 31, wherein the relative dielectric constant of the non-linear resistor layer is ≦10.*

*35. The matrix liquid crystal display device of claim 31, wherein the additional component in the non-linear resistor layer is N or Si.*

*36. The matrix liquid crystal display device of claim 31, wherein the non-linear resistor layer further includes an oxidated Ta and N derivative.*

*37. The matrix liquid crystal display device of claim 31, wherein the additional component in the non-linear resistor layer is an oxide, nitride or oxynitride of Ta.*

*38. The matrix liquid crystal display device of claim 31, wherein the first conductive portion is Ta having a crystal structure of α-Ta.*

*39. The matrix liquid crystal display device of claim 31, wherein the additional component is N in a molar concentration of between about 5 and 25%.*

*40. The matrix liquid crystal display device of claim 31, wherein each picture element electrode is divided into sections, and wherein a two-terminal element couples each picture element electrode section to one of the first or second electrodes.*

*41. The matrix liquid crystal display device of claim 40, wherein the additional component in the non-linear resistor layer of the two terminal element is N or Si.*

*42. The matrix liquid crystal display device of claim 31, wherein the first conductive portion is Ta and includes nitrogen at a molar concentration of between about 5 and 45%.*

*43. The matrix liquid crystal display device of claim 42, wherein the crystal structure of the Ta first conductive portion is a mixture of α-Ta and $Ta_2N$.*

*44. The matrix liquid crystal display device of claim 42, wherein the specific resistivity of the Ta first conductive portion is between 60 and 300 μohm-cm.*

*45. The matrix liquid crystal display device of claim 31, including an insulation film of oxide, nitride or oxynitride formed on one of the first or second substrates, the two-terminal elements being formed on the insulation film.*

*46. The matrix liquid crystal display device of claim 45, wherein the oxynitride film formed on the substrate is Ta oxynitride.*

*47. A non-linear resistor element in a matrix substrate, comprising:*

*a substrate;*

*an insulating underlying film including N-$TaO_x$ on the substrate, wherein x is any number such that $TaO_x$ is a stable oxide of Ta;*

*a first conductive film of one of Ta and N-Ta on the underlying film;*

*an element non-linear resistor layer on the first conductive film, the non-linear resistor layer including N-$TaO_x$ having 5 to 25 atomic % N; and*

*a second conductive film on the element non-linear resistor layer.*

*48. The non-linear resistor element of claim 47, wherein the first conductive film includes N-Ta including about 5 to 45 atomic percent N.*

*49. The non-linear resistor element of claim 48, wherein the second conductive film includes Cr.*

* * * * *